(12) United States Patent
Choi et al.

(10) Patent No.: US 11,355,498 B2
(45) Date of Patent: Jun. 7, 2022

(54) INTEGRATED CIRCUIT DEVICE AND MANUFACTURING METHOD THEREOF

(71) Applicant: Samsung Electronics Co., Ltd., Suwon-si (KR)

(72) Inventors: Jaybok Choi, Yongin-si (KR); Yongseok Ahn, Seoul (KR); Seunghyung Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/902,506

(22) Filed: Jun. 16, 2020

(65) Prior Publication Data

US 2021/0104529 A1 Apr. 8, 2021

(30) Foreign Application Priority Data

Oct. 4, 2019 (KR) ........................ 10-2019-0123350

(51) Int. Cl.
*H01L 27/108* (2006.01)
*H01L 21/308* (2006.01)
*H01L 21/762* (2006.01)
*H01L 21/306* (2006.01)

(52) U.S. Cl.
CPC .... *H01L 27/10876* (2013.01); *H01L 21/3081* (2013.01); *H01L 21/3086* (2013.01); *H01L 21/30604* (2013.01); *H01L 21/76224* (2013.01); *H01L 27/10823* (2013.01)

(58) Field of Classification Search
None
See application file for complete search history.

(56) References Cited

U.S. PATENT DOCUMENTS

| 9,263,317 | B2 | 2/2016 | Park et al. |
| 2013/0115745 | A1 | 5/2013 | Chung et al. |
| 2013/0122685 | A1* | 5/2013 | Kim ................ H01L 21/76232 438/424 |
| 2017/0040423 | A1* | 2/2017 | Inoue ..................... H01L 29/06 |

FOREIGN PATENT DOCUMENTS

| CN | 105097641 A | 11/2015 |
| KR | 101075526 B1 | 10/2011 |
| KR | 10-2015-0094073 A | 8/2015 |

* cited by examiner

*Primary Examiner* — Hsien Ming Lee
(74) *Attorney, Agent, or Firm* — Harness, Dickey & Pierce, P.L.C.

(57) ABSTRACT

A method of manufacturing an integrated circuit device includes: over a substrate, forming first hard mask patterns extending in a first direction parallel to a top surface of the substrate and arranged at a first pitch in a second direction; forming a plurality of first trenches in the substrate using the first hard mask patterns as etching masks; forming a plurality of first gate electrodes on inner walls of the plurality of first trenches; over the substrate, forming second hard mask patterns extending in the first direction and arranged at a second pitch in the second direction; forming a plurality of second trenches in the substrate using the second hard mask patterns as etching masks, each of the plurality of second trenches being disposed between two adjacent first trenches; and forming a plurality of second gate electrodes on inner walls of the plurality of second trenches.

20 Claims, 44 Drawing Sheets

INTEGRATED CIRCUIT DEVICE AND MANUFACTURING METHOD THEREOF

CROSS-REFERENCE TO RELATED APPLICATION

This application claims the benefit of Korean Patent Application No. 10-2019-0123350, filed on Oct. 4, 2019, in the Korean Intellectual Property Office, the disclosure of which is incorporated herein in its entirety by reference.

BACKGROUND

Inventive concepts relate to an integrated circuit device and/or a manufacturing method thereof, and more particularly, to an integrated circuit device including a buried channel array transistor (BCAT) and/or a manufacturing method thereof.

As the integration of an integrated circuit device increases and the size thereof decreases, gaps between adjacent gate electrodes of a BCAT have been reduced. In particular, the difficulties of a process of forming a plurality of trenches arranged at reduced intervals in a substrate and a process of forming gate electrodes in the plurality of trenches increase. For example, when gaps between the plurality of trenches are narrow, shape deformations of the gate electrodes may occur, for example due to stress induced in the gate electrode forming process, and thus, electrical characteristics of the integrated circuit device may be degraded.

SUMMARY

Inventive concepts provides a method of manufacturing an integrated circuit device capable of reducing or preventing or reducing the likelihood of shape deformations of gate electrodes in a gate electrode forming process.

Inventive concepts also provide an integrated circuit device having improved electrical characteristics such as an improved refresh characteristic and/or the like by reducing or preventing or reducing the likelihood of shape deformations of gate electrodes in a gate electrode forming process.

According to some example embodiments of inventive concepts, there is provided a method of manufacturing an integrated circuit device, including forming first hard mask patterns over a substrate, the first hard mask patterns extending in a first direction parallel to a top surface of the substrate, the first hard mask patterns arranged at a first pitch in a second direction, the second direction perpendicular to the first direction, forming a plurality of first trenches in the substrate by using the first hard mask patterns as etching masks, forming a plurality of first gate electrodes in the plurality of first trenches, forming second hard mask patterns over the substrate, the second hard mask patterns extending in the first direction and arranged in the second direction at a second pitch, forming a plurality of second trenches in the substrate by using the second hard mask patterns as etching masks, wherein each of the plurality of second trenches is between two adjacent first trenches of the plurality of first trenches, and forming a plurality of second gate electrodes in the plurality of second trenches.

According to some example embodiments of inventive concepts, there is provided a method of manufacturing an integrated circuit device, including: forming first hard mask patterns over a substrate, the first hard mask patterns extending in a first direction parallel to a top surface of the substrate, the first hard mask patterns arranged at a first pitch in a second direction, the second direction perpendicular to the first direction, forming a plurality of first trenches in the substrate by using the first hard mask patterns as etching masks, removing the first hard mask patterns, forming a plurality of first gate electrodes in the plurality of first trenches, forming second hard mask patterns over the substrate, the second hard mask patterns extending in the first direction and arranged at a second pitch in the second direction, forming a plurality of second trenches in the substrate by using the second hard mask patterns as etching masks, wherein each of the plurality of second trenches is between two adjacent first trenches of the plurality of first trenches, removing the second hard mask patterns, and forming a plurality of second gate electrodes in the plurality of second trenches. In the forming the second hard mask patterns, end portions of the plurality of first gate electrodes are not vertically overlapped by the second hard mask patterns, the end portions of the plurality of first gate electrodes extending in the first direction.

According to some example embodiments of inventive concepts, there is provided a method of manufacturing an integrated circuit device, including: forming device isolation layers in a substrate, the device isolation layers defining a plurality of active areas, forming first hard mask patterns over the substrate, the first hard mask patterns extending in a first direction parallel to a top surface of the substrate, the first hard mask patterns arranged at a first pitch in a second direction, the second direction perpendicular to the first direction, forming a plurality of first trenches in the substrate by using the first hard mask patterns as etching masks, forming a plurality of first gate electrodes in the plurality of first trenches, forming second hard mask patterns over the substrate, the second hard mask patterns extending in the first direction and arranged at a second pitch in the second direction, forming a plurality of second trenches in the substrate by using the second hard mask patterns as etching masks. Each of the plurality of second trenches is between two adjacent first trenches of the plurality of first trenches. The method further comprises forming a plurality of second gate electrodes in the plurality of second trenches. The plurality of first trenches intersect with each of the plurality of active areas and the device isolation layers, and the plurality of second trenches intersect with each of the plurality of active areas and the device isolation layers.

According to some example embodiments of inventive concepts, there is provided an integrated circuit device including: a substrate comprising a memory cell area, a plurality of first gate electrodes in a plurality of first trenches in the memory cell area of the substrate and extending in a first direction parallel to a top surface of the substrate, and a plurality of second gate electrodes in a plurality of second trenches in the memory cell area of the substrate, the second gate electrodes extending in the first direction. The plurality of first gate electrodes alternate with the plurality of second gate electrodes in a second direction, the second direction parallel to the top surface of the substrate and perpendicular to the first direction, a first end portion of each of the plurality of first gate electrodes is spaced apart from an edge of the memory cell area by a first distance, and a second end portion of each of the plurality of second gate electrodes is spaced apart from the edge of the memory cell area by a second distance different from the first distance.

According to some example embodiments of inventive concepts, there is provided an integrated circuit device including: a plurality of first gate electrodes in a plurality of first trenches in a substrate, the plurality of first gate electrodes extending in a first direction parallel to a top surface of the substrate, and a plurality of second gate electrodes in a plurality of second trenches in the substrate, the plurality of second gate electrodes extending in the first direction The plurality of first gate electrodes alternate with the plurality of second gate electrodes in a second direction, the second direction parallel to the top surface of the substrate and perpendicular to the first direction, and in a plan view, a first end portion of each of the plurality of first gate electrodes protrudes outwards in the first direction with respect to a second end portion of each of the plurality of second gate electrodes.

According to some example embodiments of inventive concepts, there is provided an integrated circuit device including: device isolation layers in a substrate and defining a plurality of active areas, a plurality of first gate electrodes in a plurality of first trenches in the substrate and extending in a first direction parallel to a top surface of the substrate, and a plurality of second gate electrodes in a plurality of second trenches in the substrate and extending in the first direction. The plurality of first trenches alternate with the plurality of second trenches in a second direction, the second direction parallel to the top surface of the substrate and perpendicular to the first direction, and in a plan view, a first end portion of each of the plurality of first gate electrodes protrudes outwards in the first direction with respect to a second end portion of each of the plurality of second gate electrodes.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Hereinafter, some example embodiments of inventive concepts will be described in detail with reference to the attached drawings.

Figure 1:
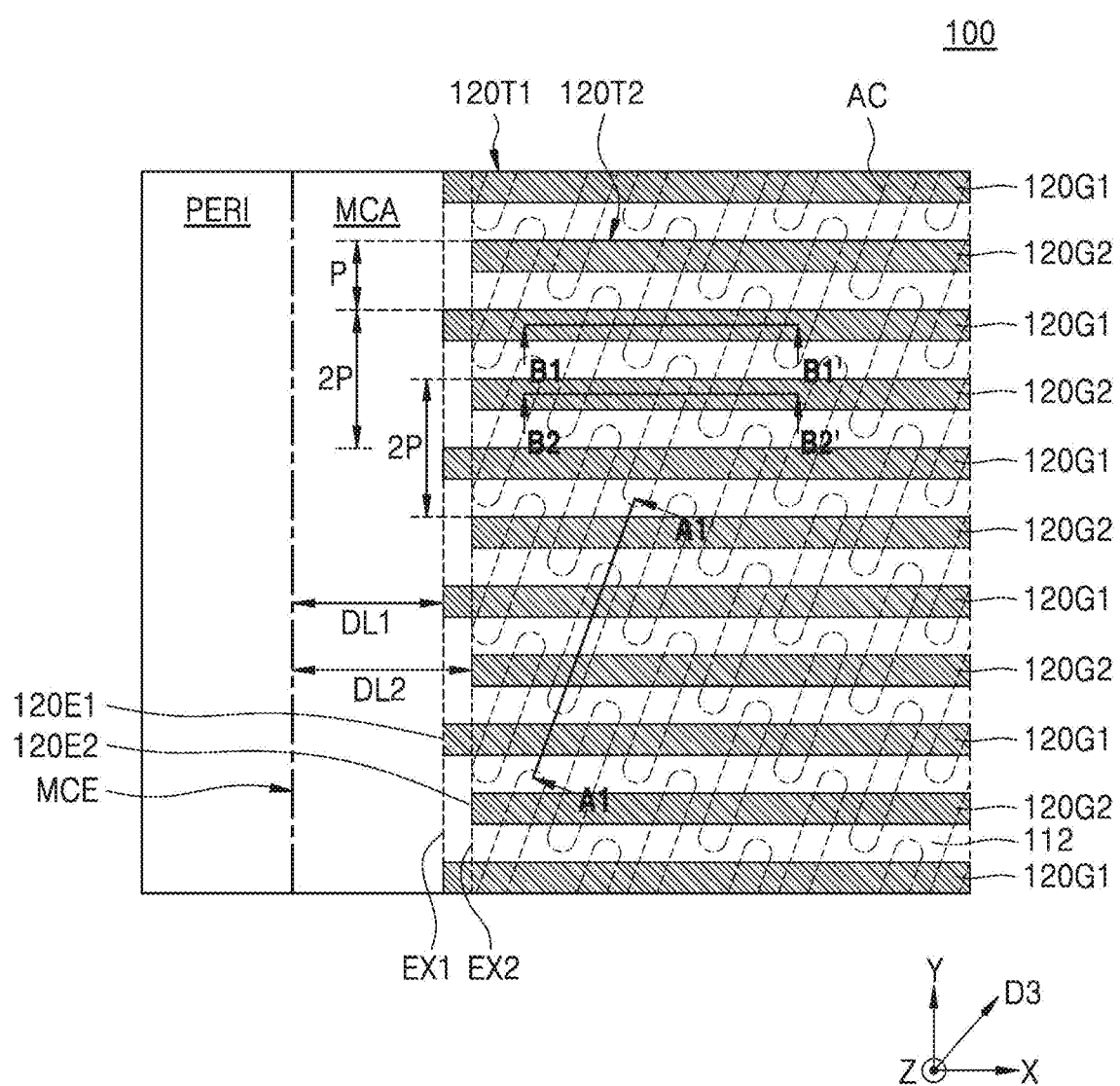
FIG. 1 is a layout diagram illustrating an integrated circuit device according to some example embodiments.
Figure 2A:
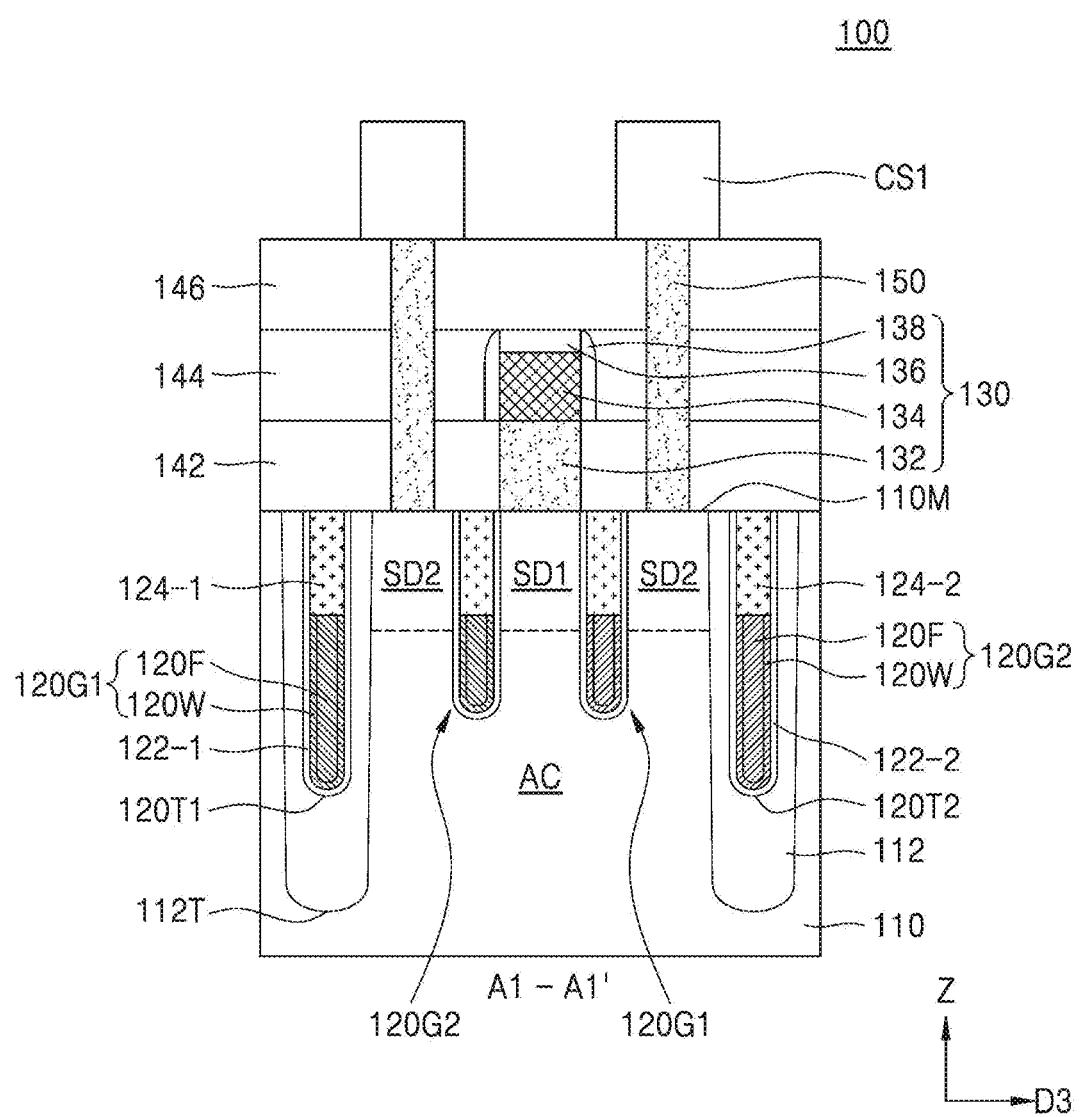
FIG. 2A is a cross-sectional view taken along line A1-A1' of FIG. 1.
Figure 2B:
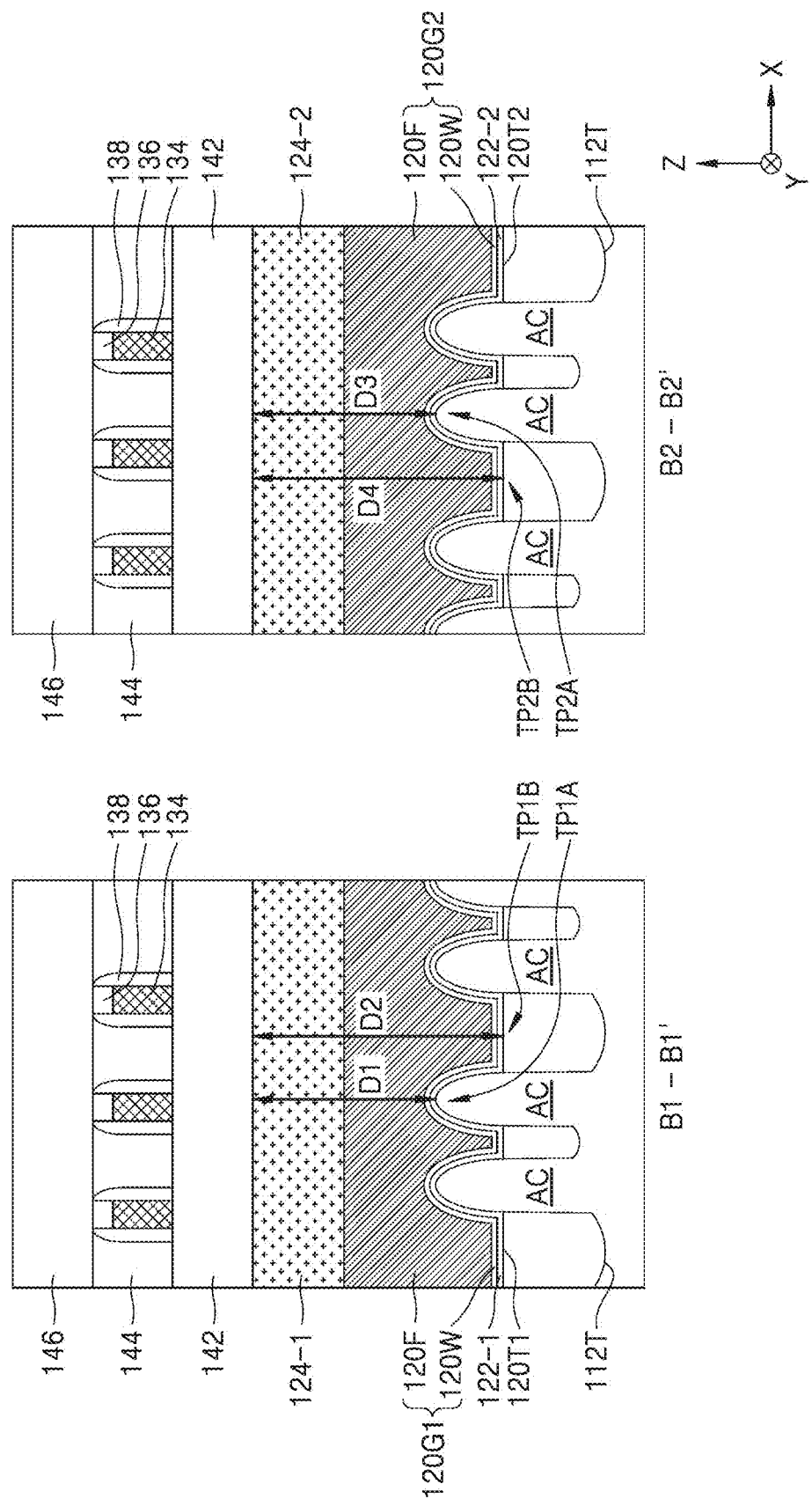
FIG. 2B is cross-sectional views taken along lines B1-B1' and B2-B2' of FIG. 1.

FIG. 1 is a layout diagram illustrating an integrated circuit device 100 according to some example embodiments. FIG. 2A is a cross-sectional view taken along line A1-A1' of FIG. 1. FIG. 2B is cross-sectional views taken along lines B1-B1' and B2-B2' of FIG. 1.

Referring to FIGS. 1 through 2B, a substrate 110 may include a memory cell area MCA and a peripheral circuit area PERI. The memory cell area MCA may be or include an area of the substrate 110 in which a device such as a dynamic random access memory (DRAM) device including a buried channel array transistor (BCAT) is formed. The peripheral circuit area PERI may be or include an area in which peripheral circuit transistors associated with reading and writing the DRAM device formed in the memory cell area MCA is formed. For example, the peripheral circuit area PERI may include transistors for driving word lines included in the memory cell area MCA. A boundary line between the memory cell area MCA and the peripheral circuit area PERI may be referred to as an edge MCE of the memory cell area MCA.

The substrate 110 may include a semiconductor material such as Si, Ge, SiGe, SiC, GaAs, InAs, or InP. In some example embodiments, the substrate 110 may include a conductive area, for example, a well doped with impurities and/or a structure doped with impurities.

A plurality of active areas AC that are defined by device isolation layers 112 may be disposed in the memory cell area MCA of the substrate 110. The device isolation layers 112 may have shallow trench isolation structures. For example, the device isolation layers 112 may include an insulating material that fills device isolation trenches 112T formed in the substrate 110. The insulating material may include at least one of fluoride silicate glass (FSG), undoped silicate glass (USG), boro-phospho-silicate glass (BPSG), phosphor-silicate glass (PSG), flowable oxide (FOX), plasma enhanced tera-ethyl-ortho-silicate (PE-TEOS), or tonen silazene (TOSZ) but inventive concepts are not limited thereto. Furthermore, the device isolation layers 112 may be formed with a high-density plasma (HDP) process and/or a spin-on glass (SOG) process; however, inventive concepts are not limited thereto.

The plurality of active areas AC may have relatively long island shapes each having a short axis and a long axis. As shown in FIG. 1, the long axes of the plurality of active areas AC may be arranged in a direction D3 parallel to a top surface 110M of the substrate 110. The direction D3 may be at an angle between 45 degrees and 80 degrees in relation to a first direction (an X direction). In some example embodiments, P-type and/or N-type impurities may be doped into the plurality of active areas AC. A concentration of P-type impurities may be different from (e.g. less than or greater than) a concentration of N-type impurities. The P-type impurities may include boron, and the N-type impurities may include phosphorus and/or arsenic; however, example embodiments are not limited thereto.

A plurality of first trenches 120T1 and a plurality of second trenches 120T2 may extend in the first direction (the X direction) parallel to the top surface 110M of the substrate 110 and may be alternately disposed in a second direction (a Y direction). The plurality of first trenches 120T1 and the plurality of second trenches 120T2 may intersect with the plurality of active areas AC and may extend from the top surface 110M of the substrate 110 into the substrate 110. For example, one active area AC of the plurality of active areas AC may intersect with one first trench 120T1 of the plurality of first trenches 120T1 at a first intersection and one second trench 120T2 of the plurality of second trenches 120T2 at a second intersection.

As shown in FIG. 2B, the plurality of first trenches 120T1 may include first portions TP1A vertically overlapping the plurality of active areas AC and second portions TP1B vertically overlapping the device isolation layers 112, and bottom surfaces of the first portions TP1A may be disposed at a higher level than bottom surfaces of the second portions TP1B. Therefore, the bottom surfaces of the first portions TP1A may have a first depth D1 from the top surface 110M of the substrate 110, the bottom surfaces of the second portions TP1B may have a second depth D2 from the top surface 110M of the substrate 110, and the second depth D2 may be deeper than the first depth D1.

Also, the plurality of second trenches 120T2 may include third portions TP2A vertically overlapping the plurality of active areas AC and fourth portions TP2B vertically overlapping the device isolation layers 112, and bottom surfaces of the third portions TP2A may be disposed at a higher level than bottom surfaces of the fourth portions TP2B. Therefore, the bottom surfaces of the third portions TP2A may have a third depth D3 from the top surface 110M of the substrate 110, the bottom surfaces of the fourth portions TP2B may have a fourth depth D4 from the top surface 110M of the substrate 110, and the fourth depth D4 may be greater than the third depth D3.

Also, the bottom surfaces of the first portions TP1A may be disposed at substantially the same level as the top surfaces of the third portions TP2A, and/or the bottom surfaces of the second portions TP1B may be disposed at substantially the same level as the bottom surfaces of the fourth portions TP2B. For example, the first depth D1 may be substantially the same as the third depth D3, and/or the second depth D2 may be substantially the same as the fourth depth D4.

First source/drain areas SD1 and second source/drain areas SD2 may be disposed in upper portions of the active areas AC positioned at both sides of the plurality of first trenches 120T1 and both sides of the plurality of second trenches 120T2, respectively. The first source/drain areas SD1 and the second source/drain areas SD2 may be or correspond to impurity areas that are doped with impurities having a conductivity type different from that of impurities doped into the active areas AC. N-type and/or P-type impurities may be doped into the first source/drain areas SD1 and the second source/drain areas SD2. A concentration of N-type impurities may be different from a concentration of P-type impurities. Additionally impurities including at least one of carbon, silicon, or germanium may be doped into the first source/drain areas SD1 and the second source/drain areas SD2; however, example embodiments are not limited thereto.

A plurality of first gate electrodes 120G1 may be disposed in the plurality of first trenches 120T1, first gate insulating layers 122-1 may be disposed between inner walls of the plurality of first trenches 120T1 and the plurality of first gate electrodes 120G1, and first gate capping layers 124-1 may be disposed on the plurality of first gate electrodes 120G1 in the plurality of first trenches 120T1. A plurality of second gate electrodes 120G2 may be disposed in the plurality of second trenches 120T2, second gate insulating layers 122-2 may be disposed between inner walls of the plurality of second trenches 120T2 and the plurality of second gate electrodes 120G2, and second gate capping layers 124-2 may be disposed on the plurality of second gate electrodes 120G2 in the plurality of second trenches 120T2.

The first and second gate insulating layers 122-1 and 122-2 may be formed of at least one selected from silicon oxide, silicon nitride, silicon oxynitride, oxide/nitride/oxide (ONO), or a high-k dielectric material having a dielectric constant higher than that of silicon oxide. For example, the first and second gate insulating layers 122-1 and 122-2 may have a dielectric constant of about 10 to about 25. In some example embodiments, the first and second gate insulating layers 122-1 and 122-2 may be formed of $HfO_2$, $ZrO_2$, $Al_2O_3$, $HfAlO_3$, $Ta_2O_3$, $TiO_2$, or a combination thereof but are not limited thereto. The first and second gate insulating layers 122-1 and 122-2 may be formed at the same time, and may be formed with a thermal oxidation process, such as a thermal oxidation process including in-situ steam generation (ISSG); however, example embodiments are not limited thereto.

The plurality of first gate electrodes 120G1 may be formed to fill the first trenches 120T1 from bottoms of the first trenches 120T1 to a preset (or, alternatively, variable) height on the first gate insulating layers 122-1. The plurality of second gate electrodes 120G2 may be formed to fill the second trenches 120T2 from bottoms of the second trenches 120T2 to a preset height on the second gate insulating layers 122-2. The plurality of first gate electrodes 120G1 and the plurality of second gate electrodes 120G2 may be filled at the same time. The first and second gate electrodes 120G1 and 120G2 may include work function control conductive layers 120W that are disposed on the first and second gate insulating layers 122-1 and 122-2 and buried conductive layers 120F that fill bottom portions of the first and second trenches 120T1 and 120T2 on the work function control conductive layers 120W. For example, the work function control conductive layers 120W may include a metal such as Ti, TiN, TiAlN, TiAlC, TiAlCN, TiSiCN, Ta, TaN, TaAlN, TaAlCN, TaSiCN, or the like, a metal nitride, or a metal carbide, and the buried conductive layers 120F may include at least one selected from W, WN, TiN, and TaN. The work function control conductive layers 120W may be formed at the same time as, or alternatively at different times from, the formation of the buried conductive layers 120F, and either or both may be formed with a vapor deposition (CVD) process such as a plasma-enhanced chemical vapor deposition (PECVD) process; however, example embodiments are not limited thereto.

The first and second gate capping layers 124-1 and 124-2 may fill residual portions of the first and second trenches 120T1 and 120T2 on the first and second gate electrodes 120G1 and 120G2. For example, the first and second gate capping layers 124-1 and 124-2 may include at least one selected from silicon oxide, silicon oxynitride, or silicon nitride, and may be formed with a CVD process; however, example embodiments are not limited thereto.

In the plan view of FIG. 1, first end portions 120E1 of the plurality of first gate electrodes 120G1 may be spaced apart from the edge MCE of the memory cell area MCA at a first distance DL1 in the first direction (the X direction), and second end portions 120E2 of the plurality of second gate electrodes 120G2 may be spaced apart from the edge MCE of the memory cell area MCA at a second distance DL2 in the first direction (the X direction). The second distance DL2 may be greater than the first distance DL1. For example, the second distance DL2 may be greater than the first distance DL1 by about 1 nm to about several hundred nm.

In the plan view of FIG. 1, the first end portions 120E1 of the plurality of first gate electrodes 120G1 may protrude outwards, e.g. toward the peripheral circuit area PERI in the first direction (the X direction) with respect to the second end portions 120E2 of the plurality of second gate electrodes 120G2. For example, the first end portions 120E1 of the plurality of first gate electrodes 120G1 may be aligned with a first extension line EX1, the second end portions 120E2 of the plurality of second gate electrodes 120G2 may be aligned with a second extension line EX2, and the first extension line EX1 and the second extension line EX2 may be spaced apart from each other in the first direction (the X direction). For example, a space distance in the first direction (the X direction) between the first extension line EX1 and the edge MCE of the memory cell area MCA may correspond to the first distance DL1, and a space distance in the first direction (the X direction) between the second extension line EX2 and the edge MCE of the memory cell area MCA may correspond to the second distance DL2.

In some example embodiments, the plurality of first gate electrodes 120G1 may be formed through a separate process from the plurality of second gate electrodes 120G2. For example, first hard mask patterns 222P may be formed over the substrate 110, the plurality of first trenches 120T1 may be formed by using the first hard mask patterns 222P as etching masks, and the plurality of first gate electrodes 120G1 may be formed in the plurality of first trenches 120T1. Thereafter, second hard mask patterns 262P may be formed over the substrate 110, the plurality of second trenches 120T2 may be formed by using the second hard mask patterns 262P as etching masks, and the plurality of second gate electrodes 120G2 may be formed in the plurality of second trenches 120T2. Positions of end portions of the first hard mask patterns 222P may not be aligned with positions of end portions of the second hard mask patterns 262P, and in this case, the first end portions 120E1 of the plurality of first gate electrodes 120G1 may be spaced apart from the second end portions 120E2 of the plurality of second gate electrodes 120G2 at a preset (or, alternatively, variable) distance, e.g., a distance by subtracting the first distance DL1 from the second distance DL2 in the first direction (the X direction).

Bitline structures 130 that extend in the Y direction parallel to the top surface 110M of the substrate 110 and perpendicular to the X direction may be formed on the first source/drain areas SD1. The bitline structures 130 may include bitline contacts 132, bitlines 134, bitline capping layers 136, and bitline spacers 138 that are sequentially stacked on the substrate 110. For example, the bitline contacts 132 may include undoped or doped polysilicon, and the bitlines 134 may include a metal material. The bitline capping layers 136 may include an insulating material such as silicon nitride, silicon oxynitride, or the like. The bitline spacers 138 may have single layer structures or multilayer structures that are formed of an insulating material such as silicon oxide, silicon oxynitride, or silicon nitride. In some example embodiments, the bitline spacers 138 may further include air spaces (not shown). Alternatively or additionally, bitline intermediate layers (not shown) may be interposed between the bitline contacts 132 and the bitlines 134. The bitline intermediate layers may include a metal silicide such as tungsten silicide or a metal nitride such as tungsten nitride.

As shown in FIG. 2A, the bitline contacts 132 are formed to have bottom surfaces at the same level as the top surface 110M of the substrate 110. Alternatively, recesses (not shown) may be formed at a preset depth from the top surface 110M of the substrate 110, the bitline contacts 132 may extend into the recesses, and thus the bottom surfaces of the bitline contacts 132 may be formed at a lower level than the top surface 110M of the substrate 110.

A first insulating layer 142, a second insulating layer 144, and a third insulating layer 146 may be sequentially stacked on the substrate 110, and the bitline structures 130 may penetrate the first insulating layer 142 and the second insulating layer 144 to be connected to the first source/drain areas SD1.

Capacitor contacts 150 may penetrate the first, second, and third insulating layers 142, 144, and 146 to be connected to the second source/drain areas SD2. In some example embodiments, the capacitor contacts 150 may include lower contact patterns (not shown), metal silicide layers (not shown), and upper contact patterns (not shown) that are sequentially stacked on the substrate 110. The capacitor contacts may additionally include barrier layers (not shown) that surround sides and bottom surfaces of the upper contact patterns. In some example embodiments, the lower contact patterns may include doped or undoped polysilicon, and the upper contact patterns may include a metal material. The barrier layers may include a metal nitride having conductivity.

Capacitor structures CS1 that are connected to the capacitor contacts 150 may be disposed on the third insulating layer 146. The capacitor structures CS1 may include lower electrodes (not shown), dielectric layers (not shown) conformally covering the lower electrodes, and upper electrodes (not shown). For example, the lower electrodes may have pillar shapes that extend in a vertical direction (a Z direction). In some example embodiments, the lower electrodes may have cylindrical shapes or cup shapes with closed bottoms. Landing pads (not shown) may be further formed between the capacitor structures CS1 and the capacitor contacts 150.

In general, as a device dimension of the integrated circuit device 100 is reduced, hard mask patterns may be formed with a technology such as quadruple patterning technology (QPT), a plurality of trenches are formed in a substrate by using the hard mask patterns as etching masks, and then, gate electrodes are formed in the plurality of trenches. However, when gaps between the plurality of trenches are narrow, shape deformations of the plurality of trenches may occur, such as bending of the plurality of trenches due to stress induced in a gate electrode forming process. As a result, shape deformations of a plurality of gate electrodes disposed in the plurality of trenches may occur, and/or precise adjustments of heights of the plurality of gate electrodes may become difficult. Accordingly, an integrated circuit device may have poor electrical characteristics such as a poor refresh characteristic.

However, according to some example embodiments described above, the plurality of first trenches 120T1 are formed by using the first hard mask patterns 222P, and the plurality of first gate electrodes 120G1 are formed in the plurality of first trenches 120T1. Thereafter, the plurality of second trenches 120T2 are formed such that each of the plurality of second trenches 120T2 is disposed between two adjacent first trenches 120T1 of the plurality of first trenches 120T1, by using the second hard mask patterns 262P, and then, the plurality of second gate electrodes 120G2 are formed in the plurality of second trenches 120T2. Therefore, in the process of forming the plurality of first gate electrodes 120G1 in the plurality of first trenches 120T1, space distances between the first trenches 120T1 are relatively large, and thus a phenomenon in which the first trenches 120T1 are bent due to stress generation in the process of forming the first gate electrodes 120G1 may be reduced or prevented. According to some example embodiments, since the shape deformations of the plurality of first gate electrodes 120G1 and the plurality of second gate electrodes 120G2 are reduced or prevented, the integrated circuit device may have an improved refresh characteristic.

FIGS. 3A through 22B are schematic plan views and cross-sectional views illustrating a method of manufacturing the integrated circuit device 100 in a process sequence, according to some example embodiments. In detail, FIGS. 3B, 4B, 5B, 6B, 7B, 8B, 9B, 10B, 11B, 12B, 13B, 14B, 15B, 16B, 17B, 18B, 19B, 20B, 21B, and 22B are cross-sectional views respectively taken along lines B-B' of FIGS. 3A, 4A, 5A, 6A, 7A, 8A, 9A, 10A, 11A, 12A, 13A, 14A, 15A, 16A, 17A, 18A, 19A, 20A, 21A, and 22A. The same reference numerals in FIGS. 3A through 22B as those in FIGS. 1 through 2B denote the same elements.

Figure 3A:
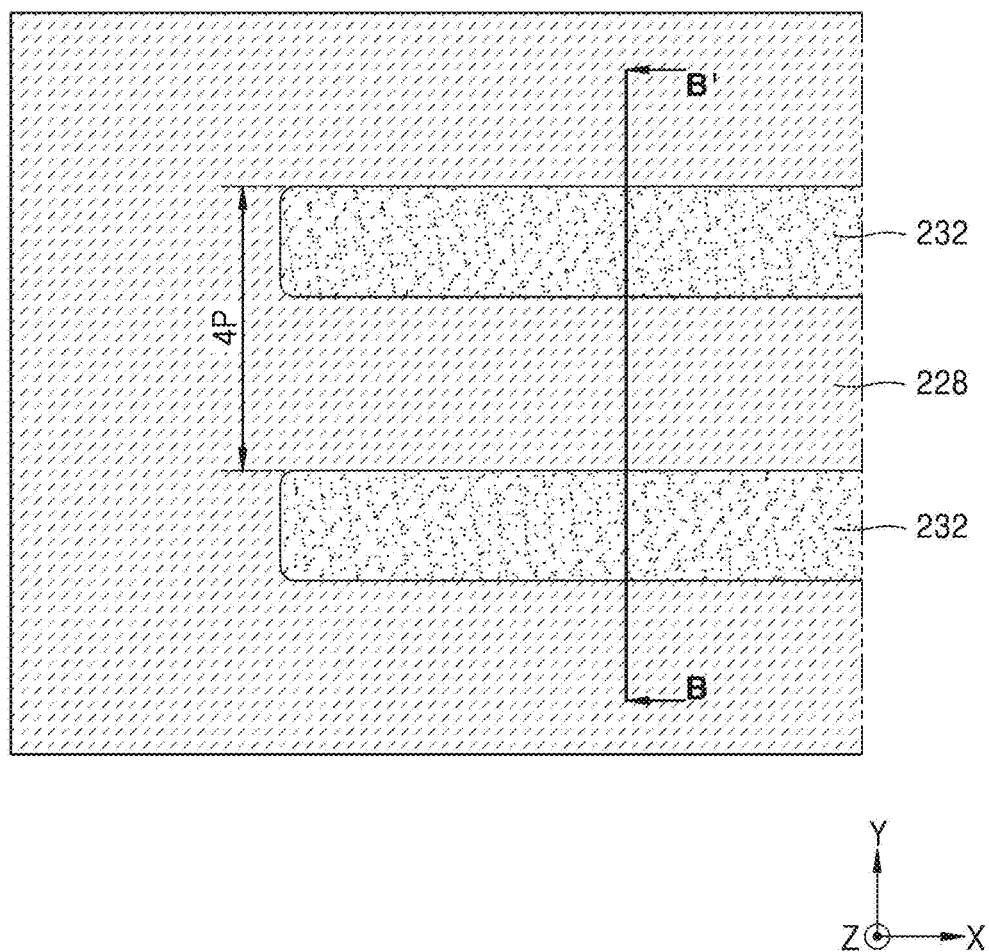
FIGS. 3A through 22B are schematic plan views and cross-sectional views illustrating a method of manufacturing an integrated circuit device in a process sequence, according to some example embodiments.
Figure 3B:
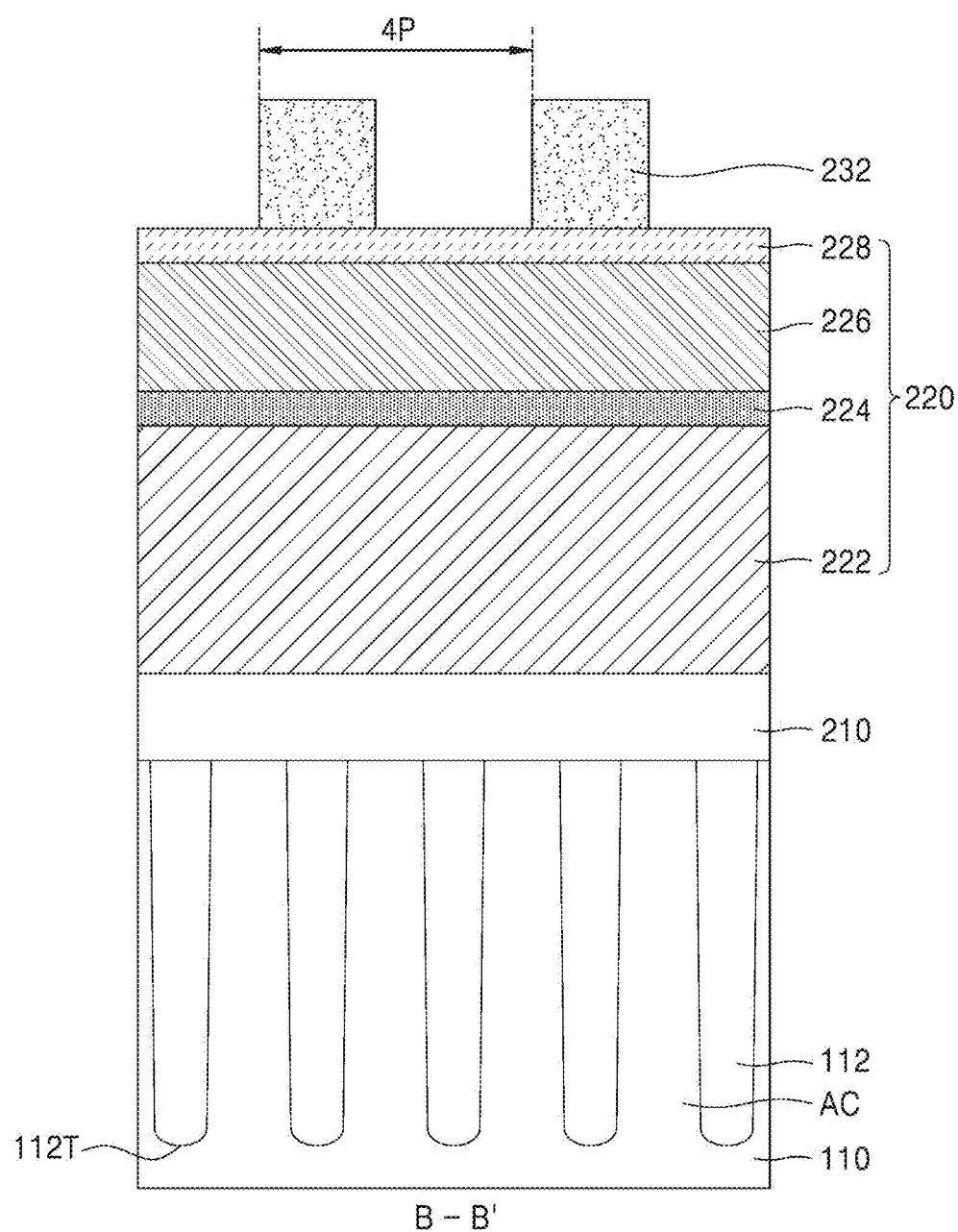

Referring to FIGS. 3A and 3B, the device isolation trenches 112T may be formed in the substrate 110, and the device isolation layers 112 may be formed in the device isolation trenches 112T. The active areas AC may be defined in the substrate 110 by the device isolation layers 112.

Thereafter, a first buffer insulating layer 210 may be formed on the substrate 110, and a first mask stack 220 may be formed on the first buffer insulating layer 210. The first mask stack 220 may include a first hard mask layer 222, a first intermediate layer 224, a first base layer 226, and a second intermediate layer 228 that are sequentially stacked on the first buffer insulating layer 210.

In some example embodiments, the first hard mask layer 222 may include an amorphous carbon layer (ACL) but example embodiments are not limited thereto. The first intermediate layer 224 and the second intermediate layer 228 may include SiON and/or spin coating layers including Si and C. The first base layer 226 may include an organic compound having a high carbon content. For example, the first base layer 226 may be formed by spin coating a solution including an organic compound having a high carbon content on the first intermediate layer 224 and baking the solution including the organic compound. The first base layer 226 may include a spin-on hardmask (SOH) material.

Thereafter, first photoresist patterns 232 may be formed on the first mask stack 220. The first photoresist patterns 232 may be repetitively formed with a pitch 4P that is 4 times larger than a pitch P (see FIG. 1) of fine patterns to be finally formed. As used herein, pitch may refer to a distance between successive corresponding fine patterns.

Figure 4A:
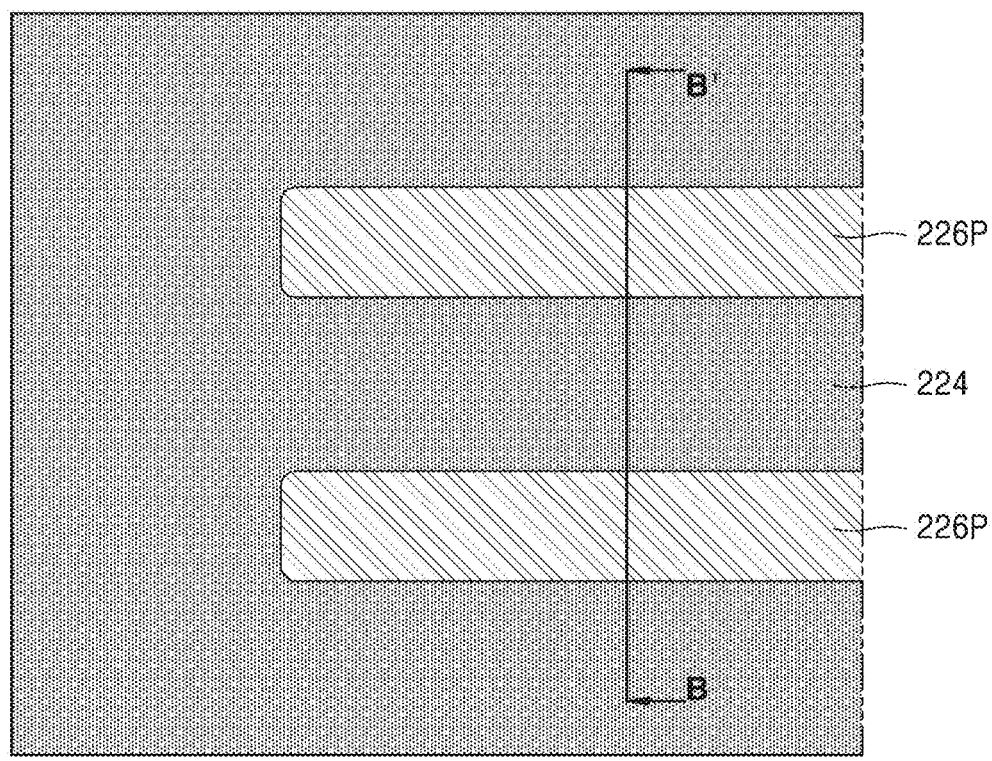
Figure 4B:
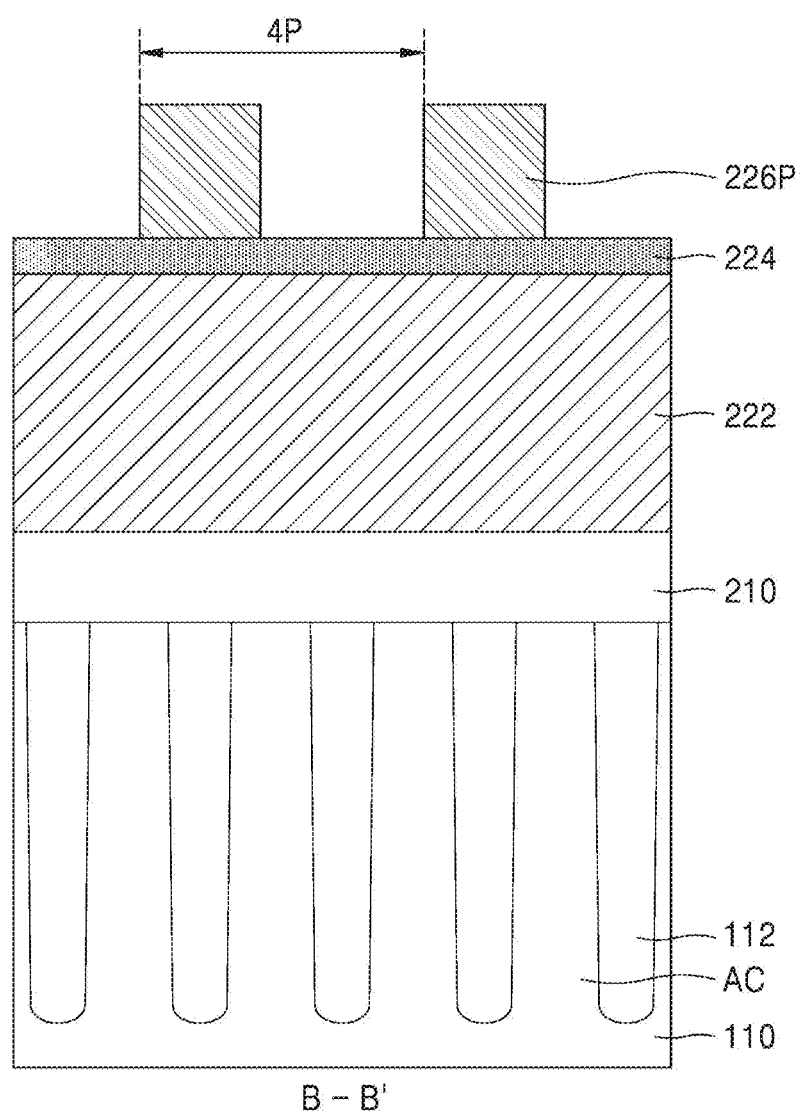

Referring to FIGS. 4A and 4B, a plurality of first base layer patterns 226P may be formed by etching the second intermediate layer 228 and the first base layer 226 by using the first photoresist patterns 232 as etching masks. The plurality of first base layer patterns 226P may be arranged at a pitch 4P corresponding to the pitch 4P of the first photoresist patterns 232.

Although FIG. 4B illustrates the second intermediate layer 228 positioned on the plurality of first base layer patterns 226P may be all removed, and top surfaces of the plurality of first base layer patterns 226P may be exposed, example embodiments are not limited thereto. For example, unlike as illustrated in FIG. 4B, a portion of the second intermediate layer 228 positioned on the plurality of first base layer patterns 226P may remain.

Figure 5A:
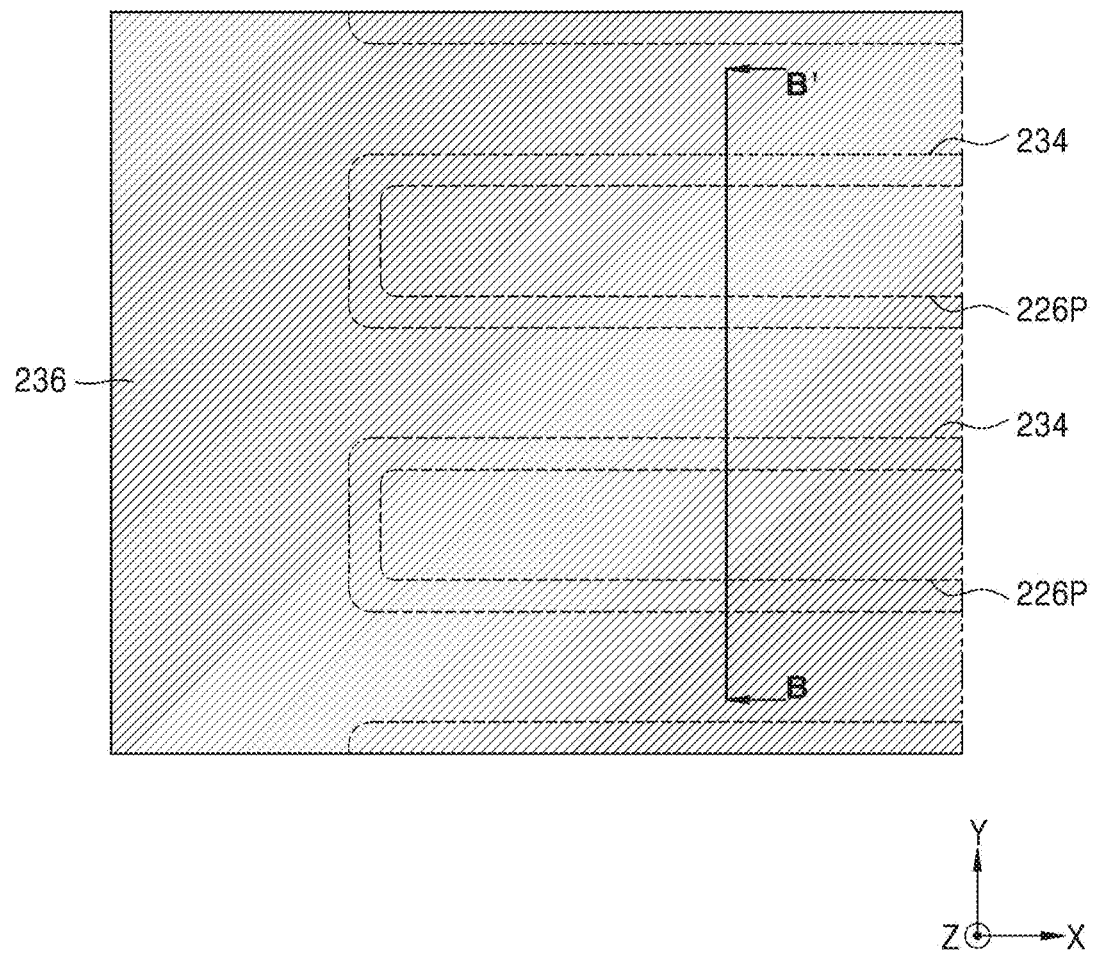
Figure 5B:
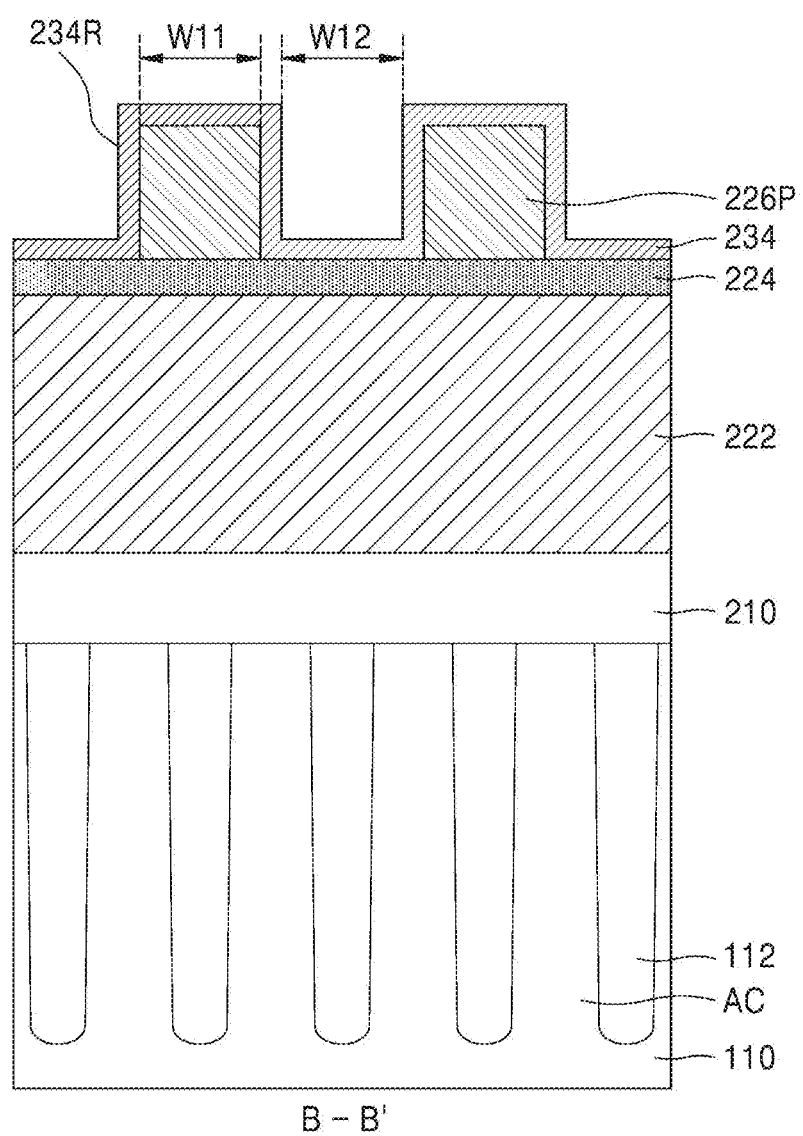

Referring to FIGS. 5A and 5B, a first liner 234 may be formed on a top surface of the first intermediate layer 224 and on sides and top surfaces of the plurality of first base layer patterns 226P. The first liner 234 may include silicon oxide or the like formed by an atomic layer deposition (ALD) process.

The first liner 234 may be formed to conformally cover the plurality of first base layer patterns 226P, and thus may not entirely fill a space between two adjacent first base layer patterns 226P of the plurality of first base layer patterns 226P. A plurality of recesses 234R may be defined by a top surface of the first liner 234 formed in the space between the two adjacent first base layer patterns 226P of the plurality of first base layer patterns 226P. A thickness of the first liner 234 may be selected such that a width W11 of one first base layer pattern 226P in the first direction (the X direction) among the plurality of first base layer patterns 226P is substantially the same as a width W12 of one recess 234R in the first direction (the X direction) among the plurality of recesses 234R. For example, the thickness of the first liner 234 may be between about 1 nm to about 10 nm.

Figure 6A:
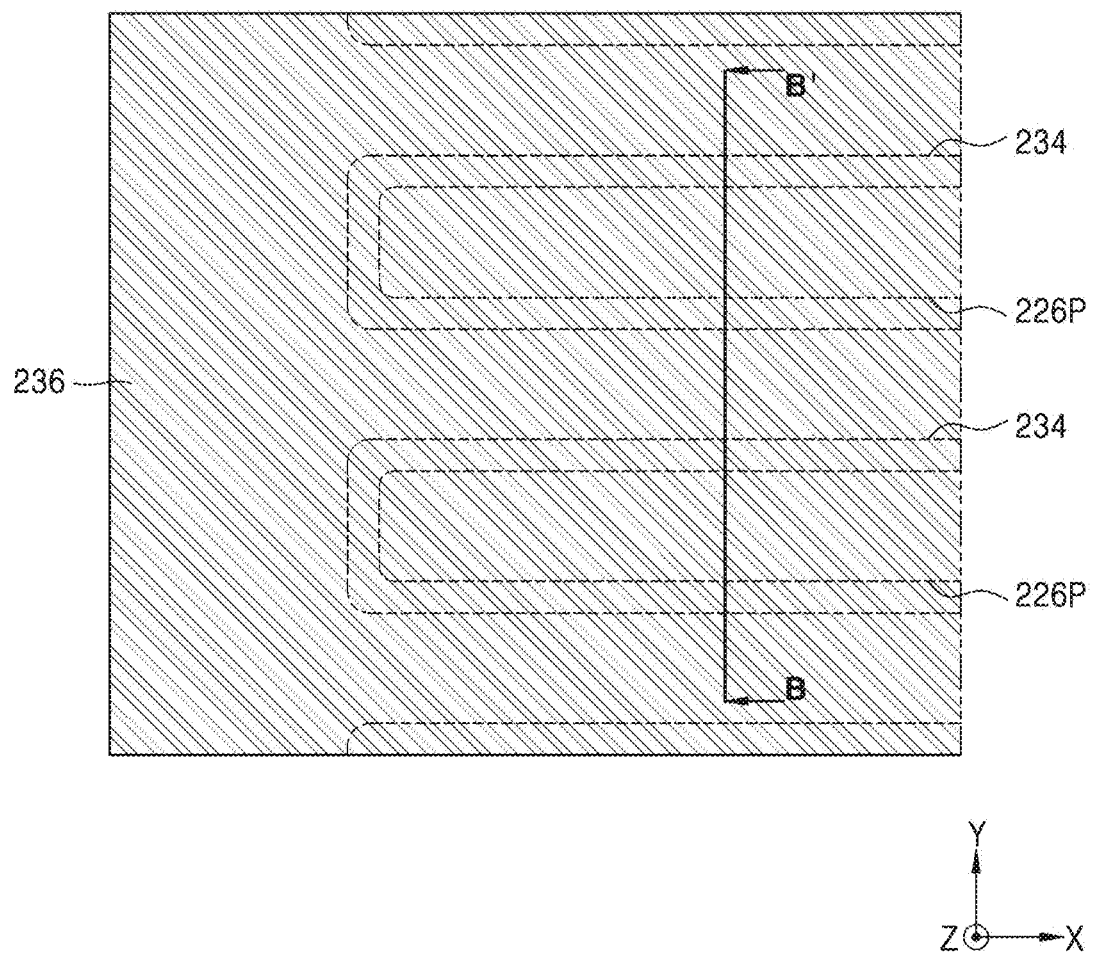
Figure 6B:
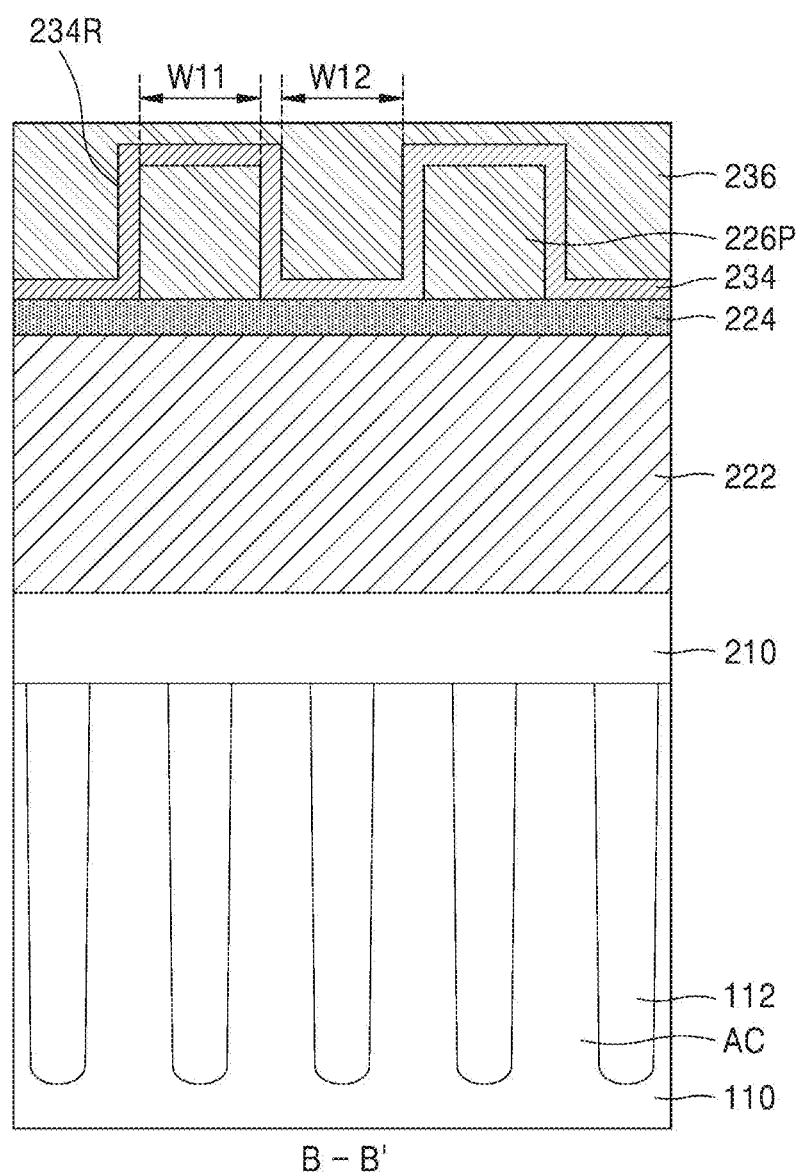

Referring to FIGS. 6A and 6B, a first buried layer 236 that fills the plurality of recesses 234R may be formed on the first liner 234. The first buried layer 236 may include an organic compound having a high carbon content. For example, the first buried layer 236 may include an organic compound including a hydrocarbon compound and a derivative thereof. For example, the first buried layer 236 may be formed by spin coating a solution including an organic compound having a high carbon content on the first intermediate layer 224 and baking the solution including the organic compound. The first buried layer 236 may include an SOH material. The first buried layer 236 may be formed by using the same material as the first base layer 226. The first buried layer 236 may be formed with a thickness large enough to cover both the first base layer patterns 226P and the top surface of the first liner 234. Alternatively, the first buried layer 236 may be formed with a thickness to dispose a top surface thereof at a level lower than or equal to the top surface of the first liner 234.

Figure 7A:
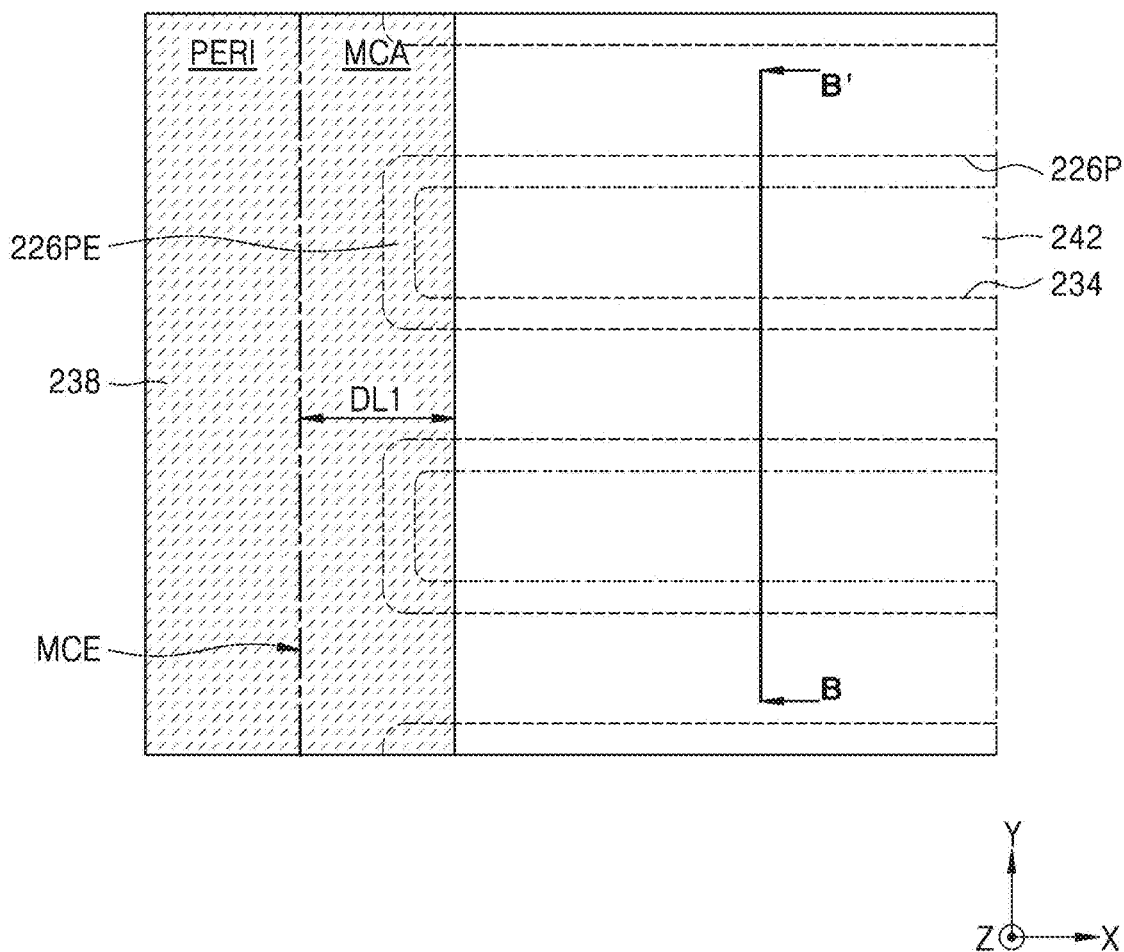
Figure 7B:
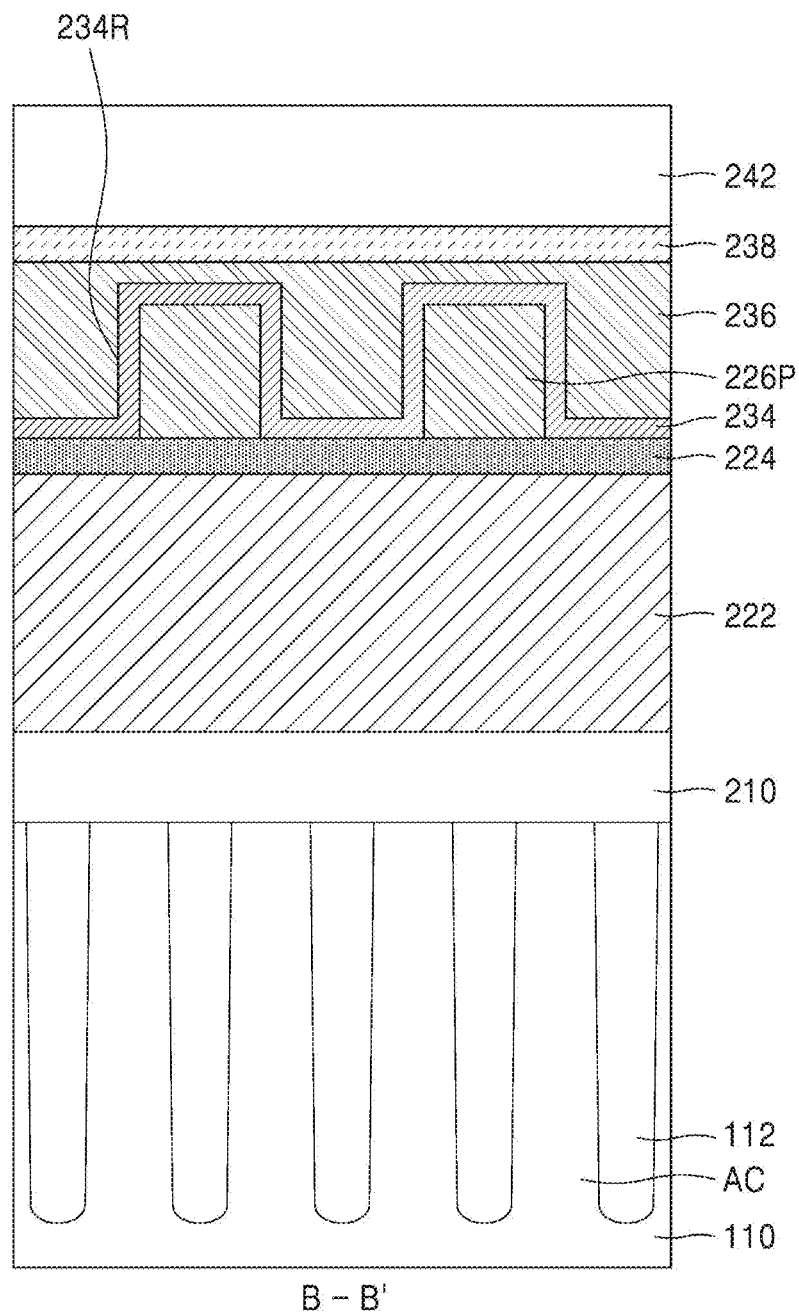

Referring to FIGS. 7A and 7B, a third intermediate layer 238 may be formed on the first buried layer 236. The third intermediate layer 238 may include SiON and/or a spin coating layer including Si and C.

Thereafter, a first trimming mask pattern 242 may be formed on the third intermediate layer 238. The first trimming mask pattern 242 may be disposed to not cover edge portions 226PE of the first base layer patterns 226P adjacent to the edge MCE of the memory cell area MCA. For example, the first trimming mask pattern 242 is spaced apart from the edge MCE of the memory cell area MCA at the first distance DL1. In some example embodiments, the first trimming mask pattern 242 may be formed of a photoresist material including silicon but example embodiments are not limited thereto.

Figure 8A:
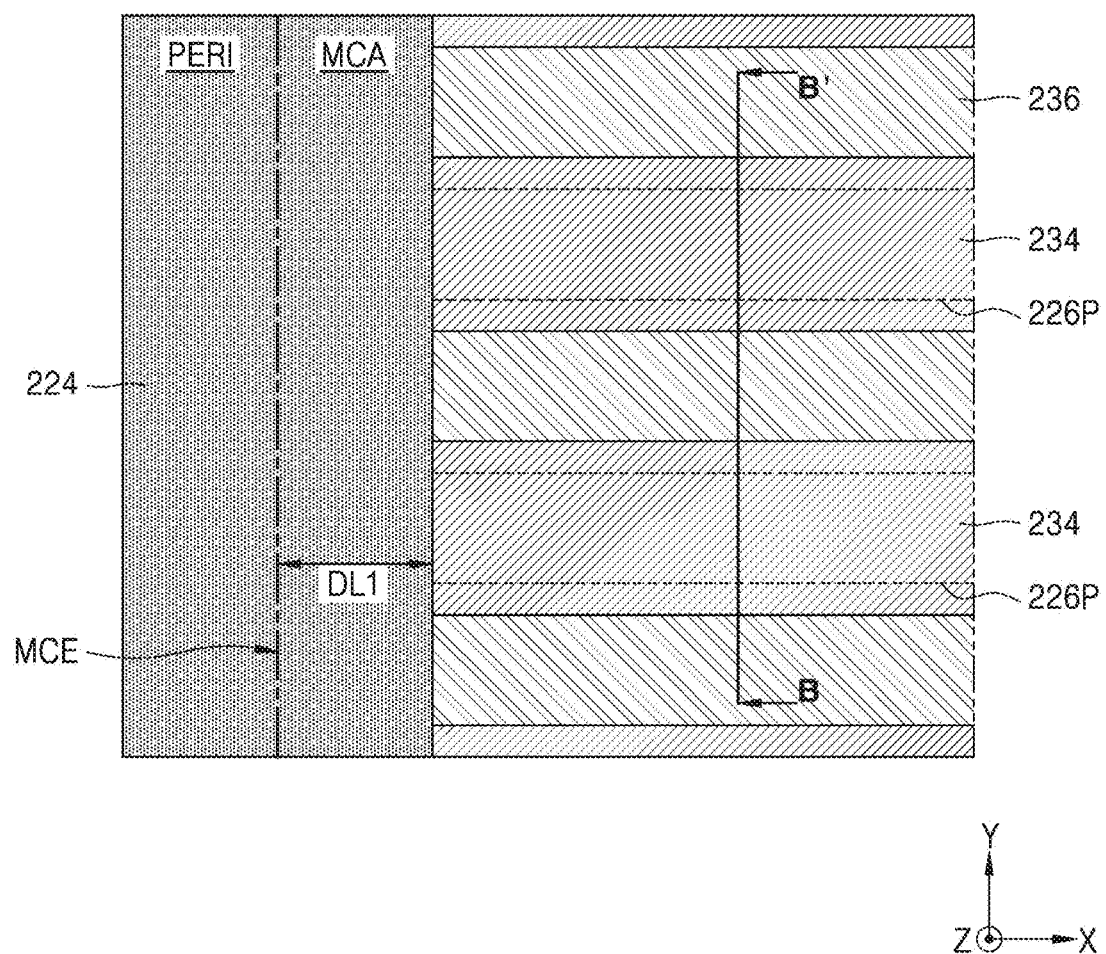
Figure 8B:
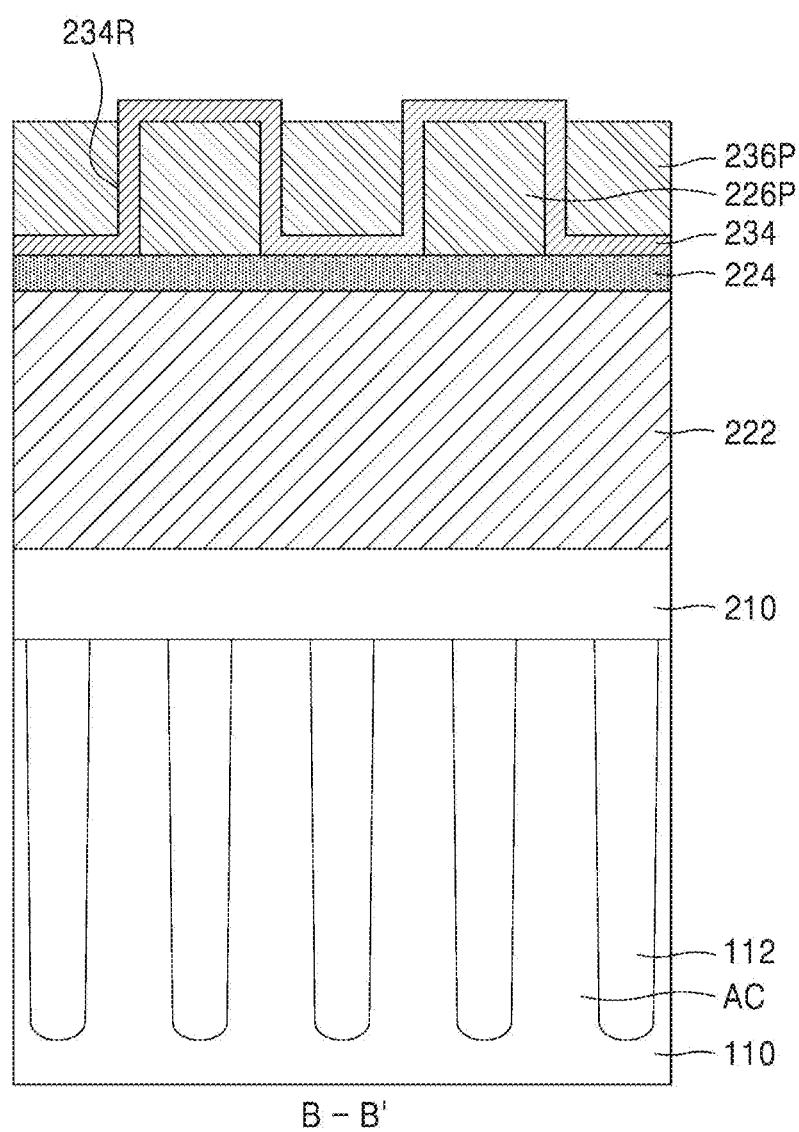

Referring to FIGS. 8A and 8B, an exposed portion of the first buried layer 236 may be etched by using the first trimming mask pattern 242 as an etching mask. Therefore, the top surface of the first liner 234 may be exposed in an area that is not covered with the first trimming mask pattern 242 (e.g., an area adjacent to the edge MCE of the memory cell area MCA and the peripheral circuit area PERI). For example, an etching process such as a dry etching process including at least one selected from CO, $N_2$, or Ar may be performed to etch the exposed portion of the first buried layer 236. Thereafter, the first liner 234 and the edge portions 226PE of the first base layer patterns 226P exposed in the area that is not covered with the first trimming mask pattern 242 may be removed.

A plurality of first buried layer patterns 236P that are disposed in the recesses 234R may be formed by removing the first trimming mask pattern 242 to expose a portion of the first buried layer 236 covered with the first trimming mask pattern 242 and removing an upper portion of the first buried layer 236 until the top surface of the first liner 234 is exposed.

Figure 9A:
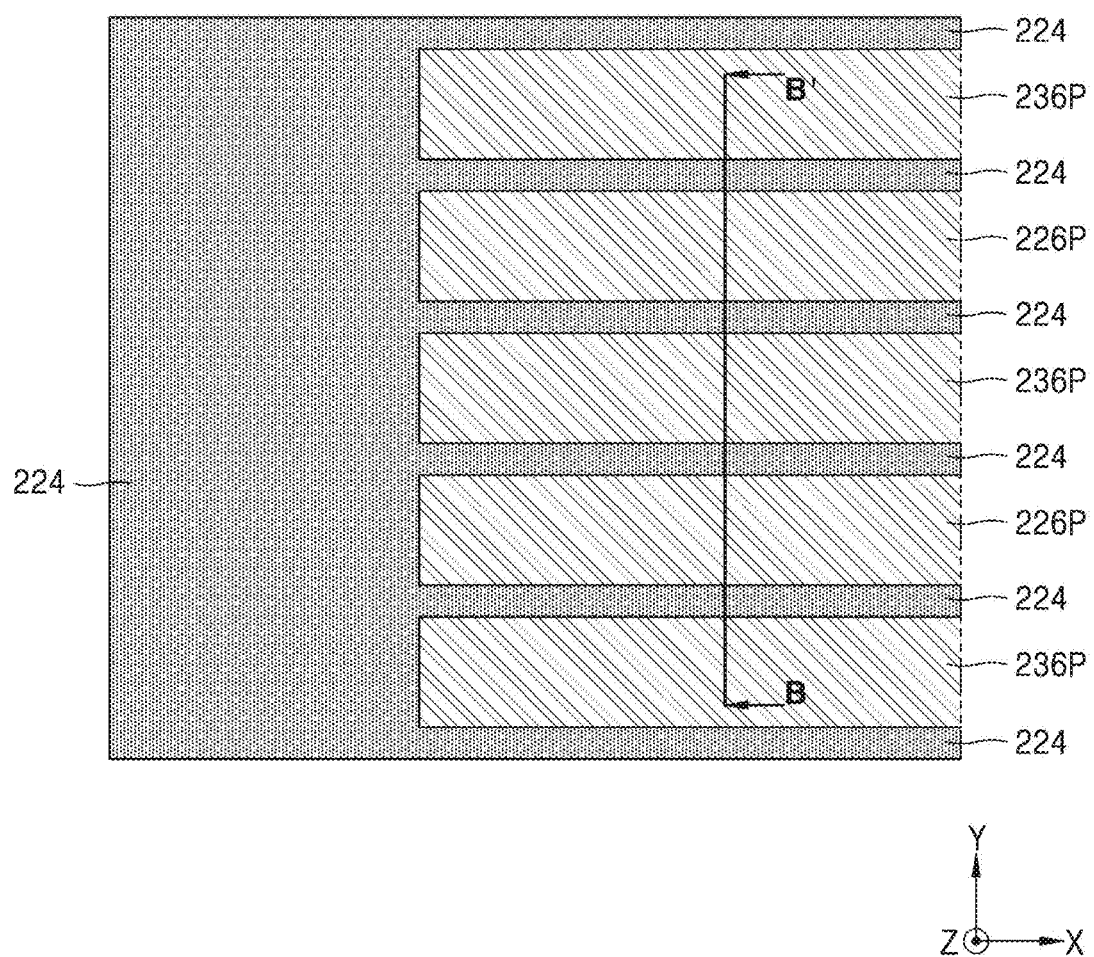
Figure 9B:
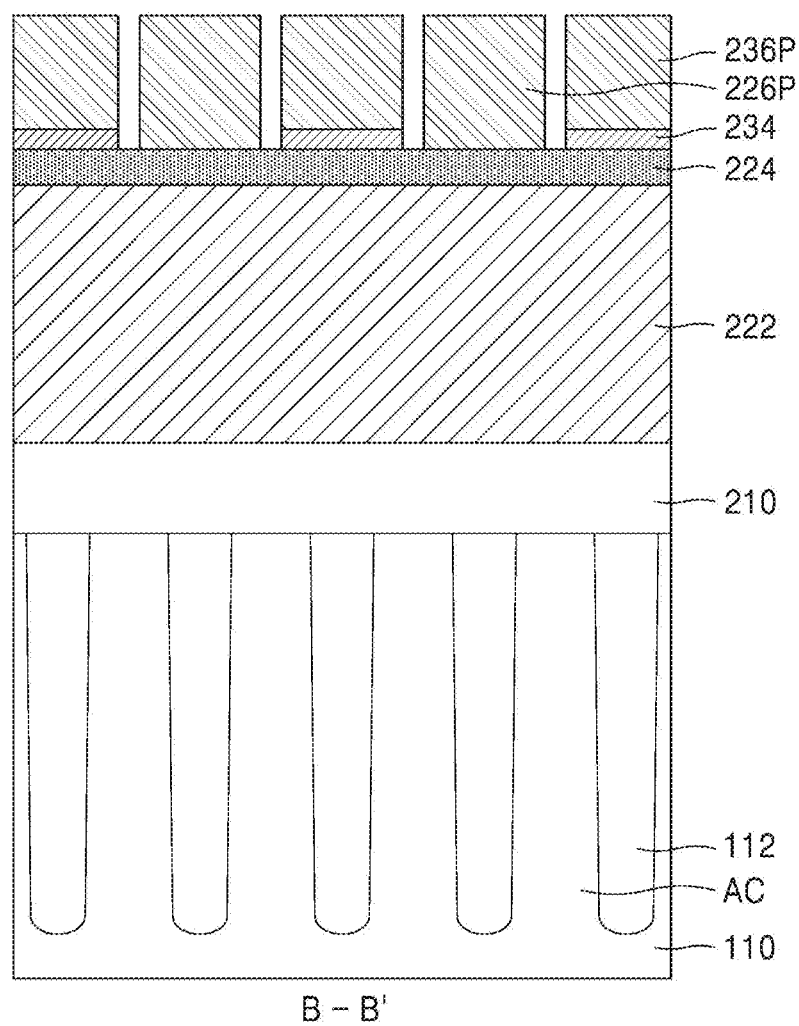

Referring to FIGS. 9A and 9B, top surfaces of the plurality of first base layer patterns 226P may be exposed by removing the exposed portion of the first liner 234. Here, the top surfaces of the plurality of first base layer patterns 226P and top surfaces of the plurality of first buried layer patterns 236P may be all exposed. Also, portions of the first liner 234 between the plurality of first base layer patterns 226P and the plurality of first buried layer patterns 236P may be removed, and thus a top surface of the first intermediate layer 224 may be exposed between the plurality of first base layer patterns 226P and the plurality of first buried layer patterns 236P. For example, the process of removing the first liner 234 may be or may include a wet etching process and/or a dry etching process.

In the plan view of FIG. 9A, the plurality of first base layer patterns 226P and the plurality of first buried layer patterns 236P may be alternately disposed. In the cross-section view of FIG. 9B, the top surfaces of the plurality of first base layer patterns 226P may be disposed at substantially the same level as the top surfaces of the plurality of first buried layer patterns 236P.

Figure 10A:
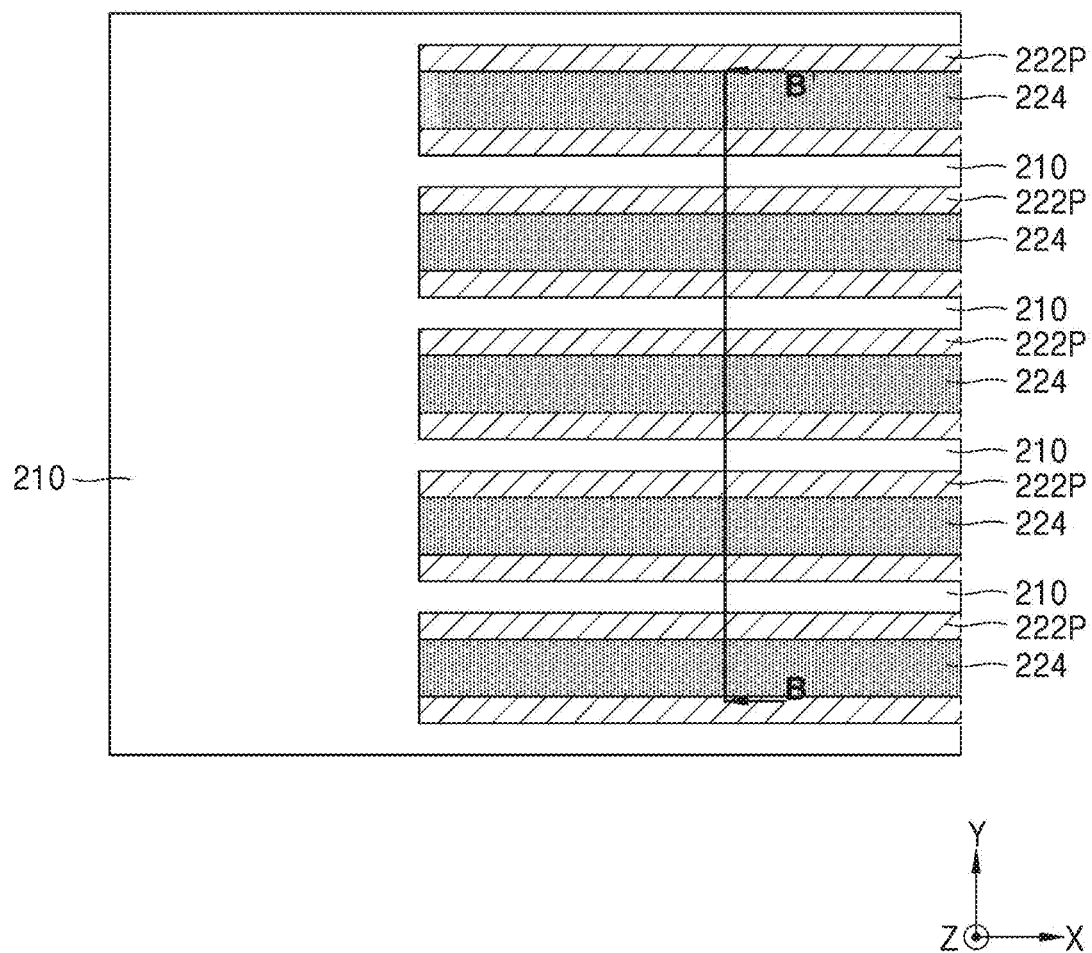
Figure 10B:
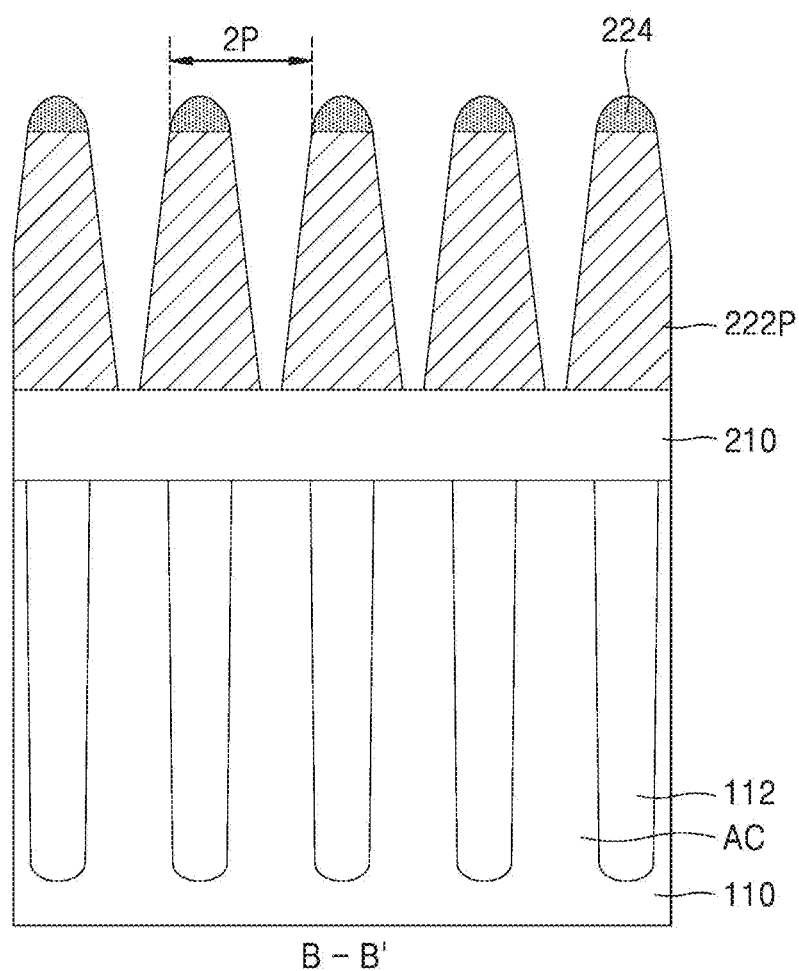

Referring to FIGS. 10A and 10B, a plurality of first hard mask patterns 222P may be formed by etching the first hard mask layer 222 by using the plurality of first base layer patterns 226P and the plurality of first buried layer patterns 236P as etching masks. Portions of the first intermediate layer 224 may remain on the plurality of first hard mask patterns 222P. Alternatively, the first intermediate layer 224 may be all removed, and top surfaces of the plurality of first hard mask patterns 222P may be exposed.

In some example embodiments, the plurality of first hard mask patterns 222P may be arranged at a first pitch of 2P, and the first pitch of 2P of the plurality of first hard mask patterns 222P may be twice the pitch P of the fine patterns to be finally formed. For example, the first pitch of 2P of the plurality of first hard mask patterns 222P may be ½ times the pitch 4P of the first photoresist patterns 232.

Figure 11A:
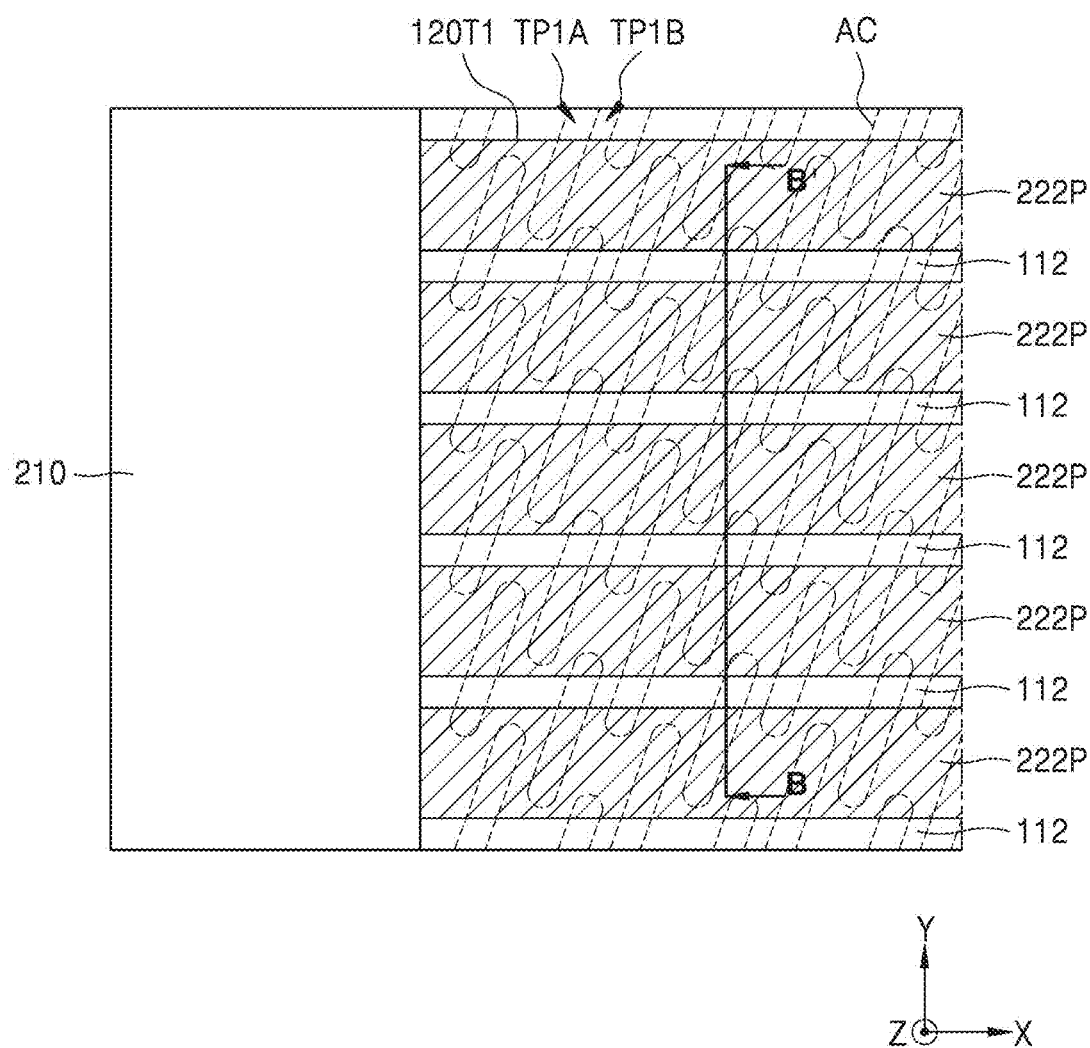
Figure 11B:
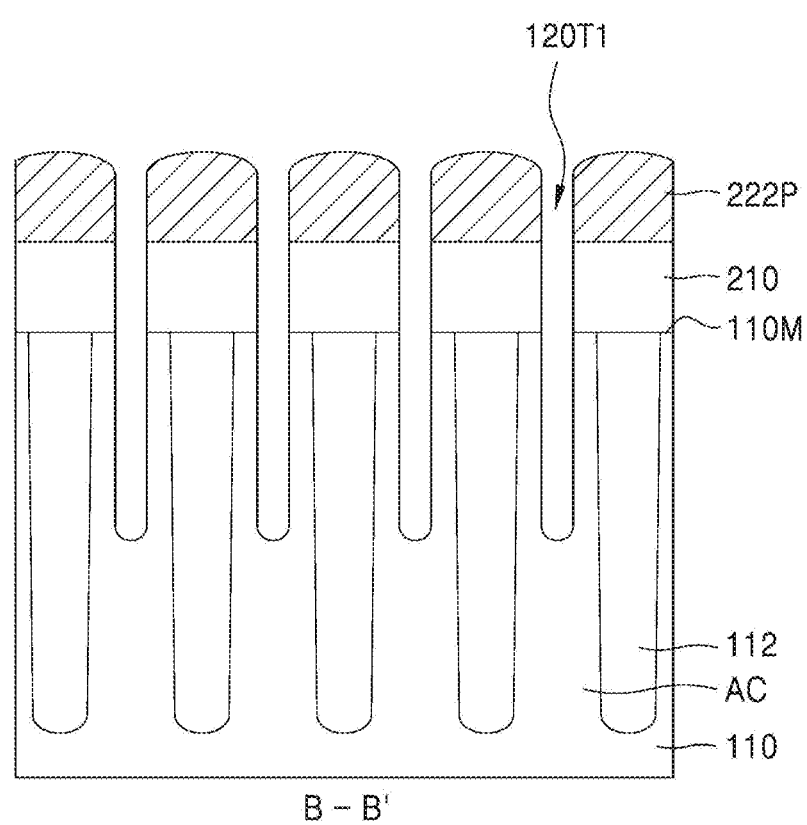

Referring to FIGS. 11A and 11B, the plurality of first trenches 120T1 may be formed by etching the first buffer insulating layer 210, the active areas AC, and the device isolation layers 112 by using the first hard mask patterns 222P as etching masks. The plurality of first trenches 120T1 may extend in the first direction (the X direction).

The plurality of first trenches 120T1 may include the first portions TP1A vertically overlapping the plurality of active areas AC and the second portions TP1B vertically overlapping the device isolation layers 112, and the bottom surfaces of the first portions TP1A may be disposed at a higher level than the bottom surfaces of the second portions TP1B. Therefore, the bottom surfaces of the first portions TP1A may have the first depth D1 (see FIG. 2B) from the top surface 110M of the substrate 110, the bottom surfaces of the second portions TP1B may have the second depth D2 (see FIG. 2B) from the top surface 110M of the substrate 110, and the second depth D2 may be greater than the first depth D1.

Figure 12A:
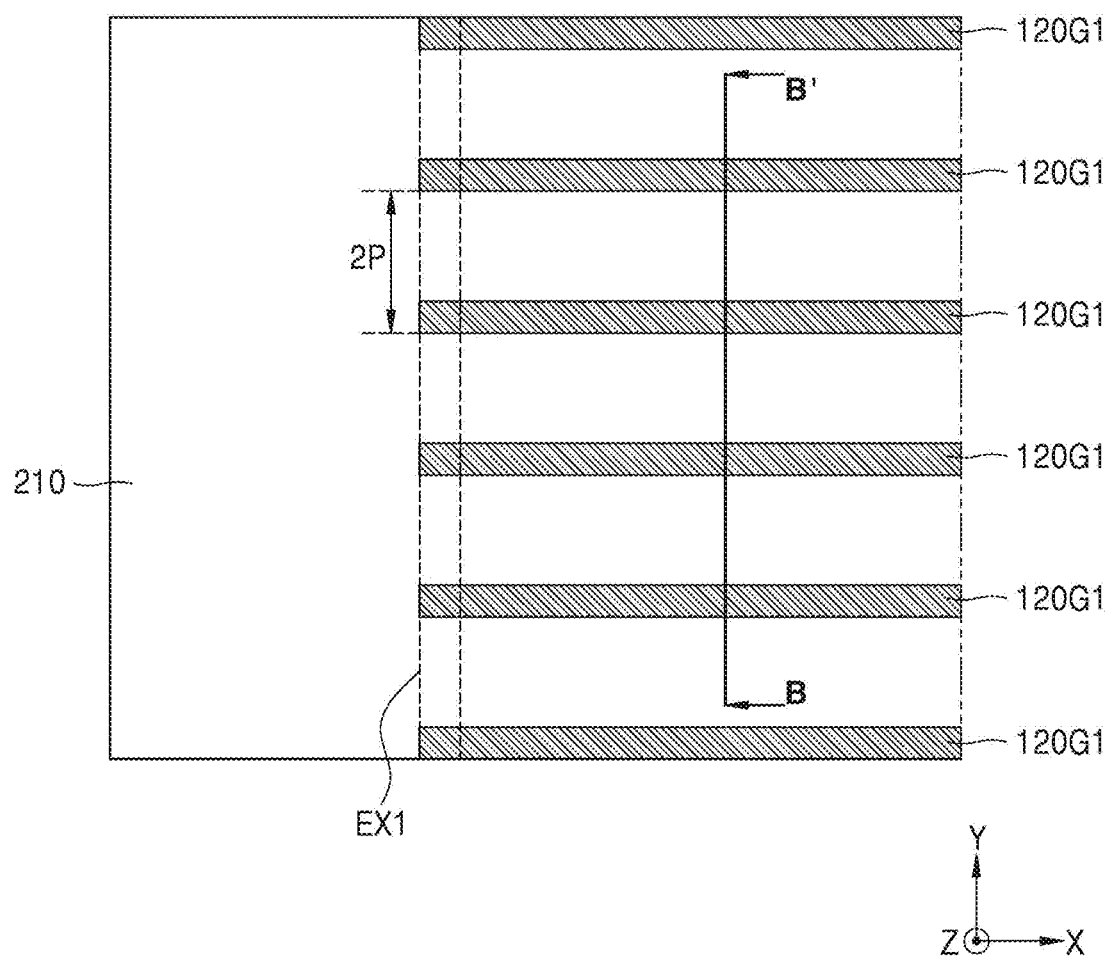
Figure 12B:
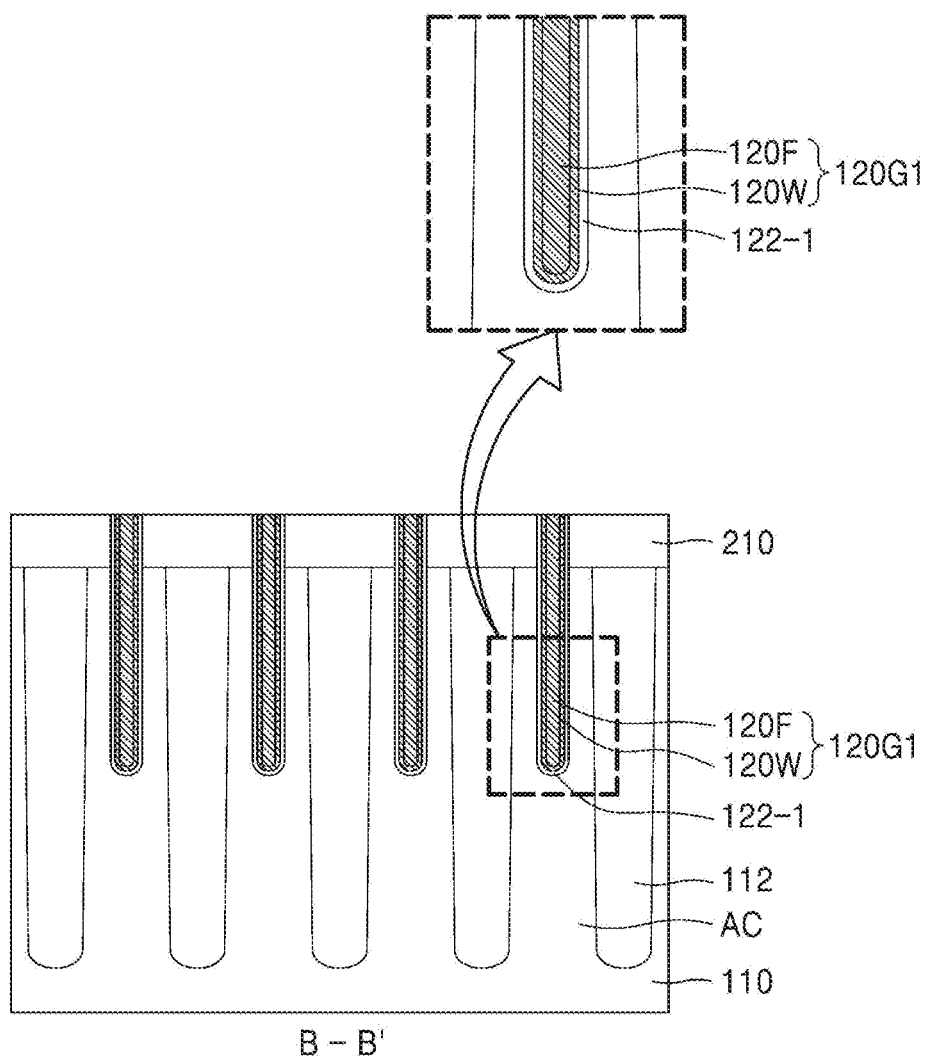

Referring to FIGS. 12A and 12B, the first hard mask patterns 222P may be removed, and the first gate insulating layers 122-1 may be formed in the plurality of first trenches 120T1. The first gate insulating layers 122-1 may be formed by at least one selected from an ALD process, a chemical vapor deposition (CVD) process, or a thermal oxidation process such as an in-situ steam generation (ISSG) process, using at least one selected from silicon oxide, silicon nitride, silicon oxynitride, ONO, or a high-k dielectric material having a dielectric constant greater than that of silicon oxide.

Thereafter, gate conductive layers (not shown) that fill the plurality of first trenches 120T1 may be formed on the first gate insulating layers 122-1, and then the plurality of first gate electrodes 120G1 may be formed by performing a planarization process such as a chemical mechanical planarization (CMP) process and/or an etch back process until a top surface of the first buffer insulating layer 210 is exposed The plurality of first gate electrodes 120G1 may include the work function control conductive layers 120W disposed on the first gate insulating layers 122-1 and the buried conductive layers 120F filling the bottom portions of the first trenches 120T1 on the work function control conductive layers 120W. For example, the work function control conductive layers 120W may include a metal, such as Ti, TiN, TiAlN, TiAlC, TiAlCN, TiSiCN, Ta, TaN, TaAlN, TaAlCN, TaSiCN, or the like, a metal nitride, or a metal carbide, and the buried conductive layers 120F may include at least one selected from W, Wn, TiN, or TaN The work function control conductive layers 120W and the buried conductive layers 120F may be formed within a same chamber or alternatively with different chambers, and may be formed with a CVD process.

In the plan view of FIG. 12A, the plurality of first gate electrodes 120G1 may be disposed at the first pitch of 2P in the second direction (the Y direction), and the first pitch of 2P may be twice the pitch P (see FIG. 1) of the fine patterns to be finally formed. The first end portions 120E1 of the plurality of first gate electrodes 120G1 may be aligned with the first extension line EX1, and the first extension line EX1 may correspond to an edge of the first trimming mask pattern 242 (see FIG. 7A).

Figure 13A:
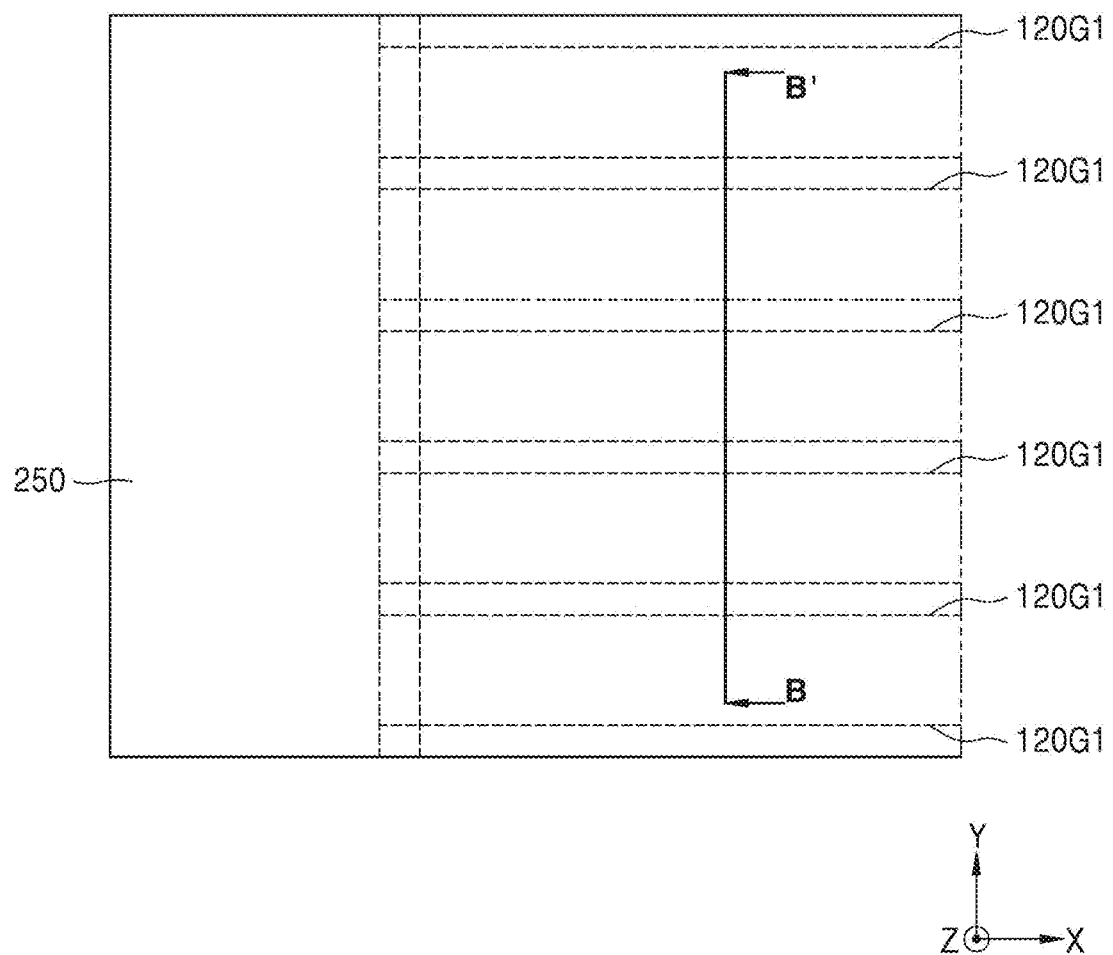
Figure 13B:
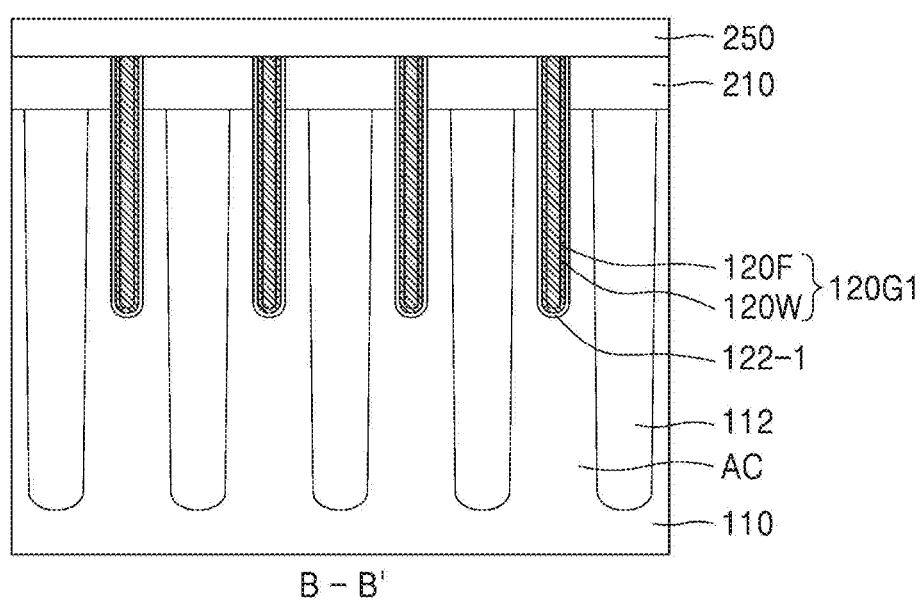

Referring to FIGS. 13A and 13B, a second buffer insulating layer 250 may be formed on the plurality of first gate electrodes 120G1 and the first buffer insulating layer 210. The second buffer insulating layer 250 may cover top surfaces of the plurality of first gate electrodes 120G1.

Figure 14A:
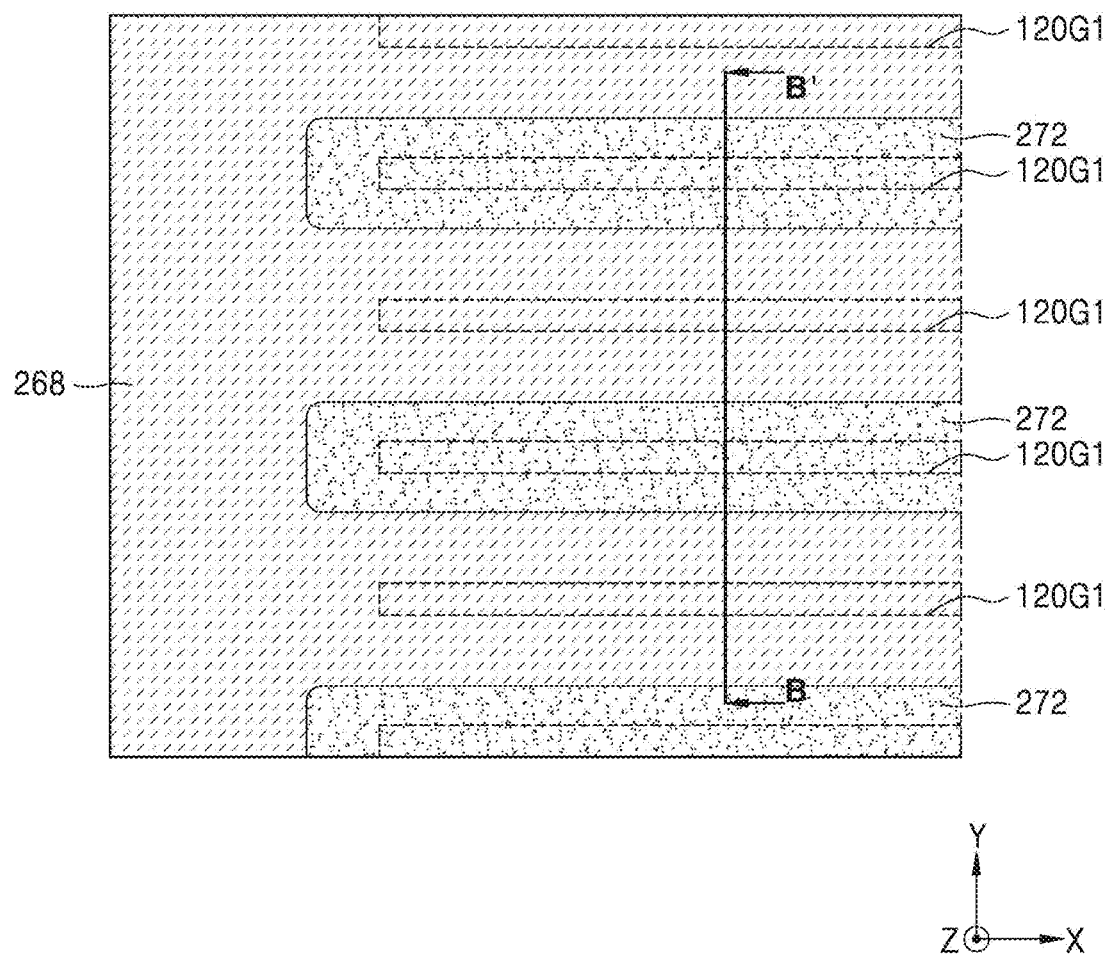
Figure 14B:
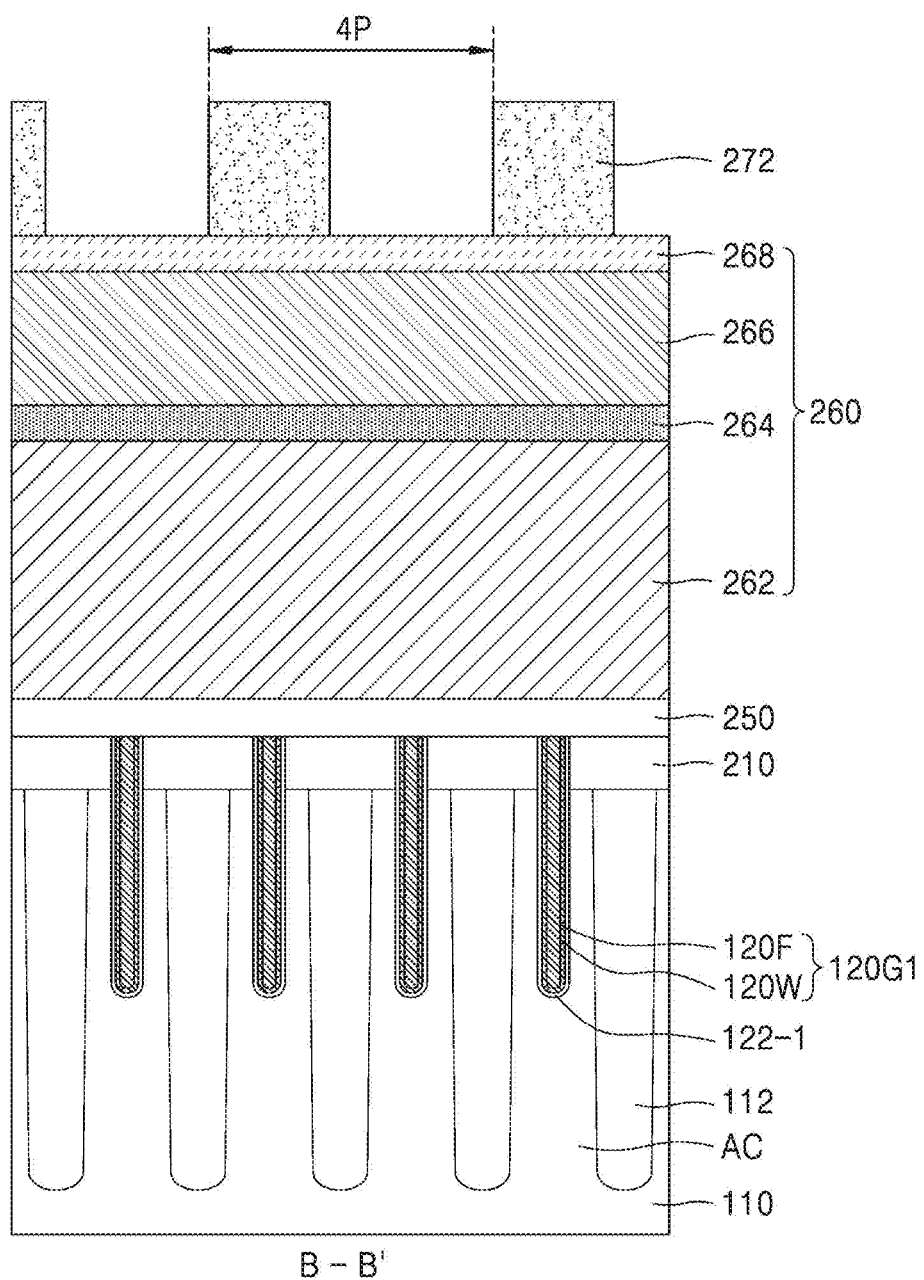

Referring to FIGS. 14A and 14B, a second mask stack 260 may be formed on the second buffer insulating layer 250. The second mask stack 260 may include a second hard mask layer 262, a fourth intermediate layer 264, a second base layer 266, and a fifth intermediate layer 268 that are sequentially stacked on the second buffer insulating layer 250. The second hard mask layer 262 may include an ACL but example embodiments are not limited thereto. The fourth intermediate layer 264 and the fifth intermediate layer 268 may include SiON and/or spin coating layers including Si and C. The second base layer 266 may include an organic compound having a high carbon content. For example, the second base layer 266 may be formed by spin coating a solution including an organic compound having a high carbon content on the fourth intermediate layer 264 and baking the solution including the organic compound. The second base layer 266 may include an SOH material. Referring back to FIG. 3B, the second hard mask layer 262, the fourth intermediate layer 264, the fifth intermediate layer 268, and the second base layer 266 may include the same, or different, materials from those of respective ones of the first hard mask layer 262, the first intermediate layer 224, the second intermediate layer 228, and the first base layer 226.

Thereafter, second photoresist patterns 272 may be formed on the second mask stack 270. The second photoresist patterns 272 may be repetitively formed with the pitch 4P that is 4 times larger than the pitch P of the fine patterns to be finally formed. The second photoresist patterns 272 may be spaced apart in the second direction (the Y direction) by the pitch P of the fine patterns to be finally formed, with respect to positions of the first photoresist patterns 232.

Figure 15A:
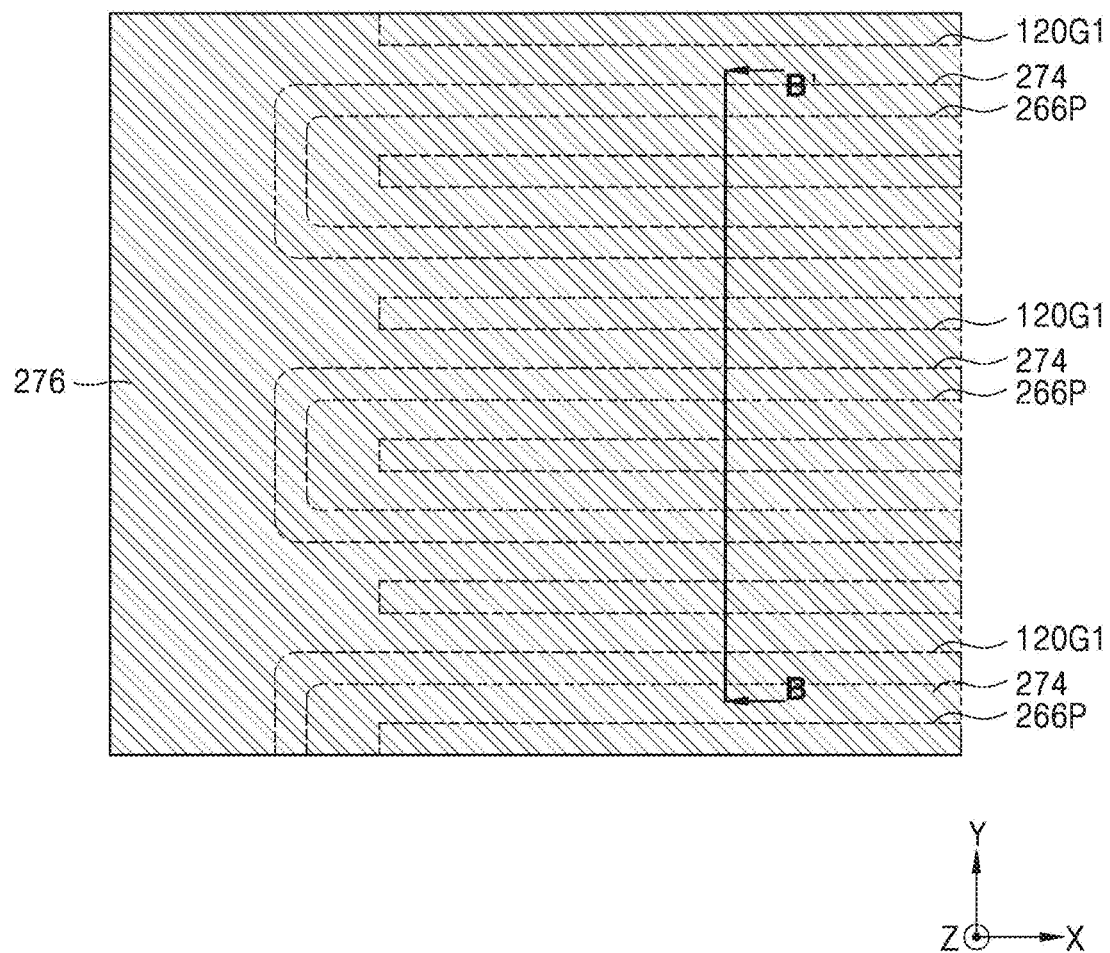
Figure 15B:
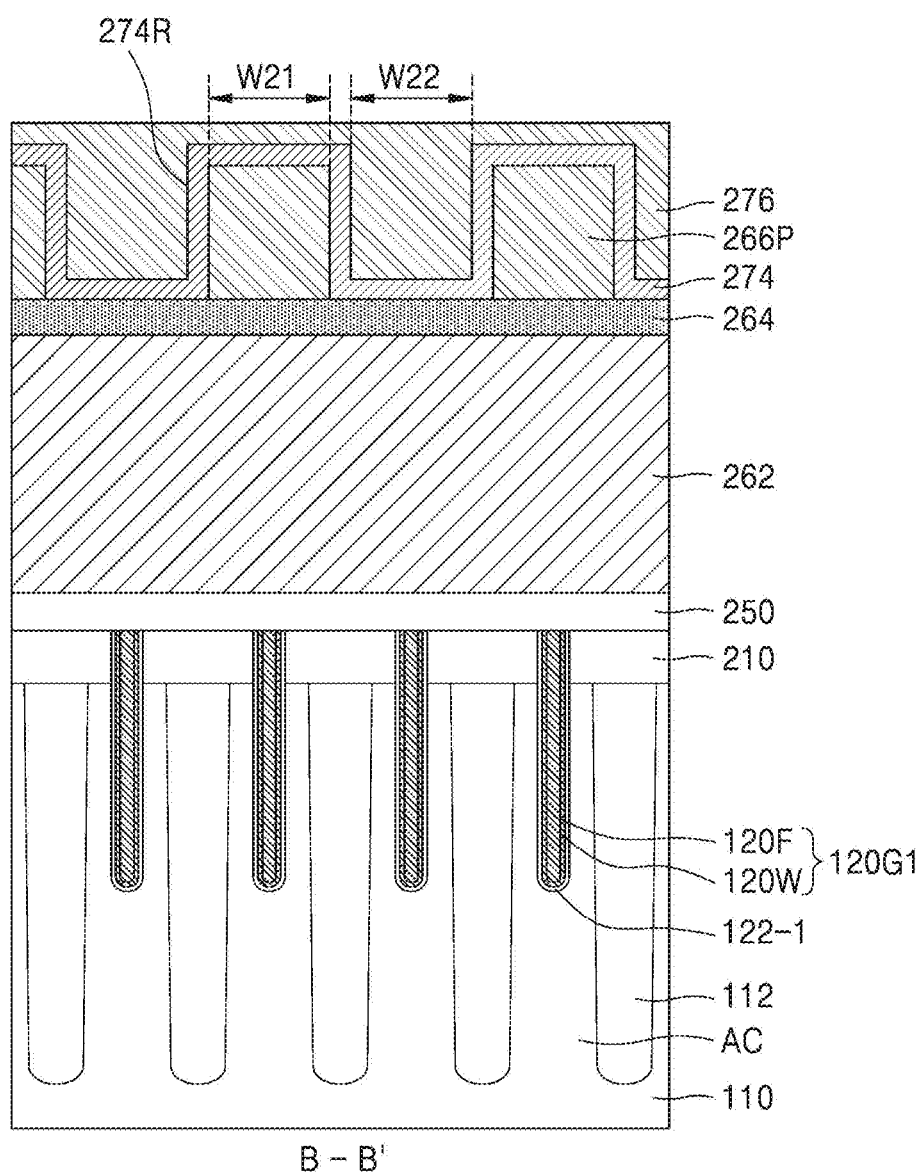

Referring to FIGS. 15A and 15B, a plurality of second base layer patterns 266P may be formed by etching the fifth intermediate layer 268 and the second base layer 266 by using the second photoresist patterns 272 as etching masks. The plurality of second base layer patterns 266P may be arranged at a pitch 4P corresponding to the pitch 4P of the second photoresist patterns 272.

Here, the fifth intermediate layer 268 positioned on the plurality of second base layer patterns 266P may be all removed, and top surfaces of the plurality of second base layer patterns 266P may be exposed.

Thereafter, a second liner 274 may be formed on a top surface of the fourth intermediate layer 264 and on sides and the top surfaces of the plurality of second base layer patterns 266P. The second liner 274 may include silicon oxide or the like that is formed by an ALD process. The second liner 274 may be formed to conformally cover the plurality of second base layer patterns 266P, and thus, a space between two adjacent second base layer patterns 266P of the plurality of second base layer patterns 266P may not be entirely filled. A plurality of recesses 274R may be defined by a top surface of the second liner 274 formed in the space between the two adjacent second base layer patterns 266P of the plurality of second base layer patterns 266P. A thickness of the second liner 274 may be selected such that a width W21 of one second base layer pattern 266P in the first direction (the X direction) among the plurality of second base layer patterns 266P is substantially the same as a width W22 of one recess 274R in the first direction (the X direction) among the plurality of recesses 274R. The second liner 274 may have the same, or different thicknesses than that of the first liner 234. The second liner 274 may be formed of the same, or different, material than that of the first liner 234.

Thereafter, a second buried layer 276 that fills the plurality of recesses 274R may be formed on the second liner 274. The second buried layer 276 may include an organic compound having a high carbon content. For example, the second buried layer 276 may be formed by spin coating a solution including an organic compound having a high carbon content on the fourth intermediate layer 264 and baking the solution including the organic compound. The second buried layer 276 may include an SOH material. The second buried layer 276 may be formed by using the same material as the second base layer 266. The second buried layer 276 may be formed using the same, or different, material from that of the first buried layer 236.

Figure 16A:
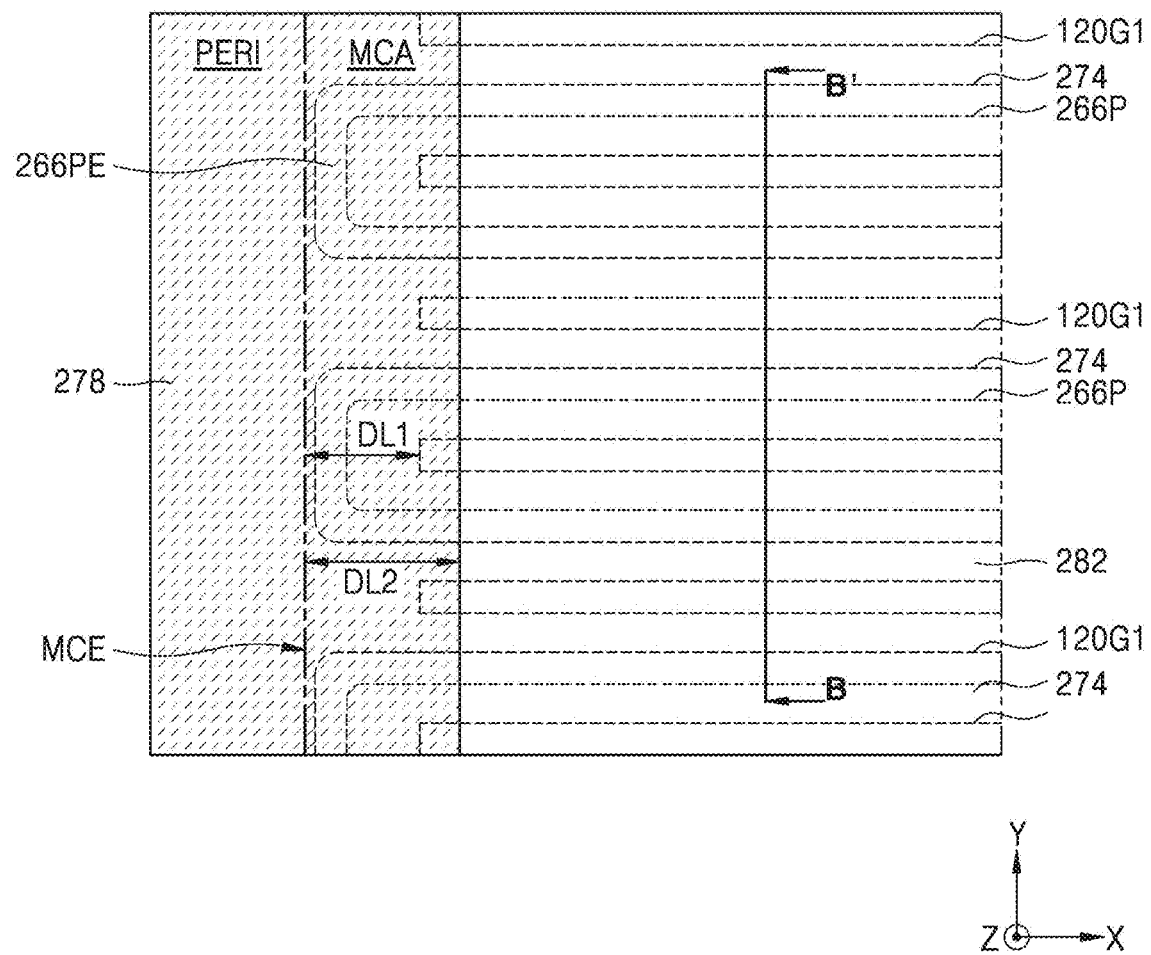
Figure 16B:
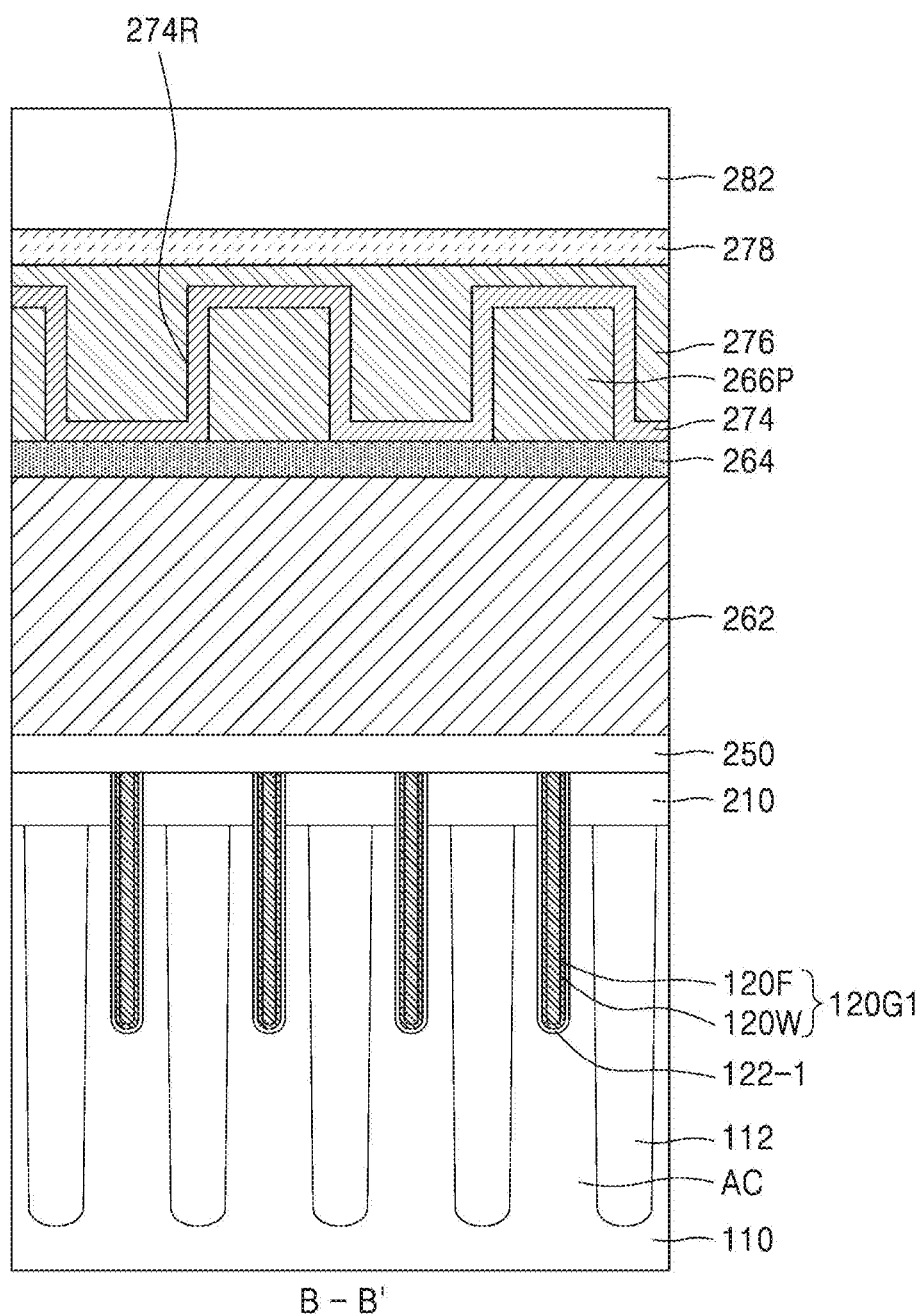

Referring to FIGS. 16A and 16B, a sixth intermediate layer 278 may be formed on the second buried layer 276. The sixth intermediate layer 278 may include SiON or a spin coating layer including Si and C. The sixth intermediate layer 278 may be formed using the same, or different, material from that of the third intermediate layer 238.

Thereafter, a second trimming mask pattern 282 may be formed on the sixth intermediate layer 278. The second trimming mask pattern 282 may be disposed to not cover the edge portions 266PE of the second base layer patterns 266P adjacent to the edge MCE of the memory cell area MCA. The second trimming mask pattern 282 may be spaced apart from the edge of the first trimming mask pattern 242. Therefore, the second trimming mask pattern 282 may be spaced apart from the edge MCE of the memory cell area MCA at the second distance DL2, and the second distance DL2 may be greater than the first distance DL1 of the first trimming mask pattern 242 from the edge MCE of the memory cell area MCA; however, example embodiments are not limited thereto, and the second distance DL2 may be less than the first distance DL1.

Figure 17A:
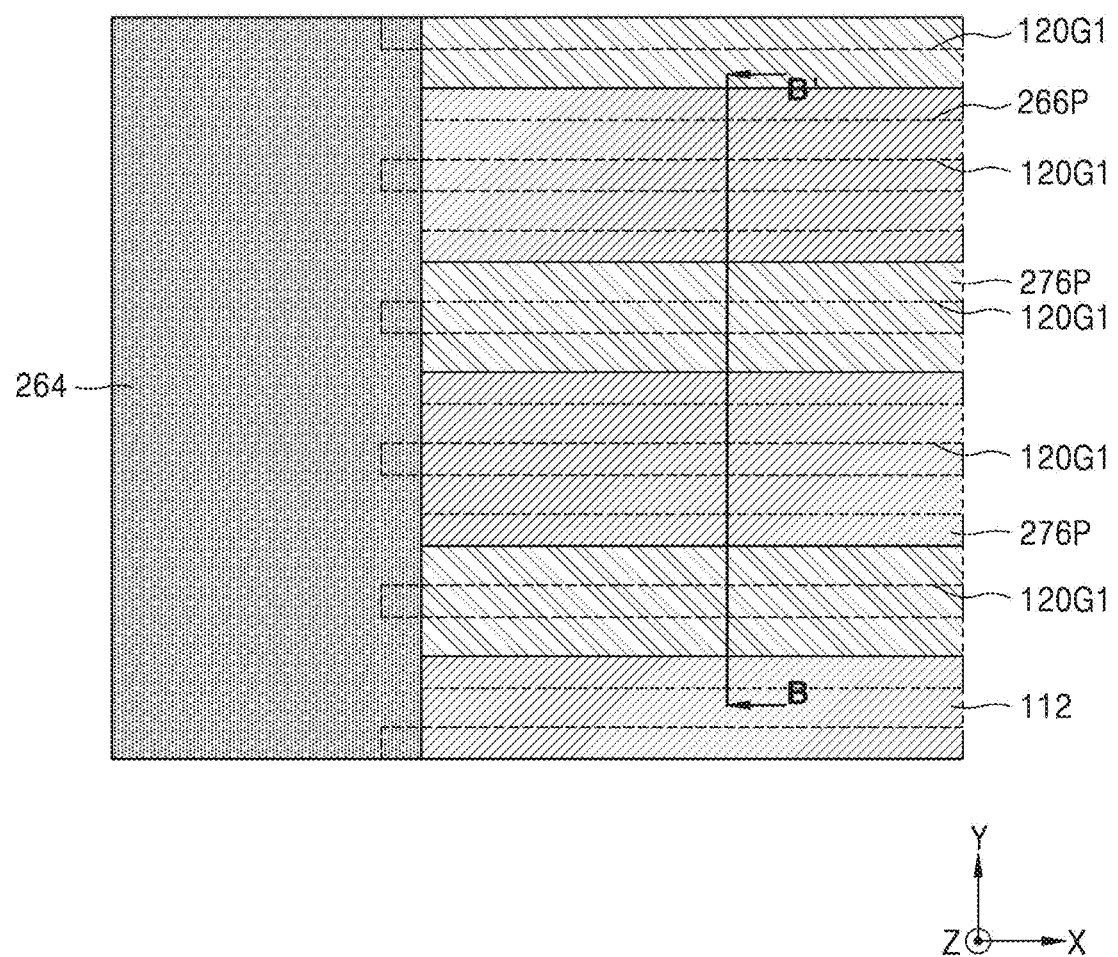
Figure 17B:
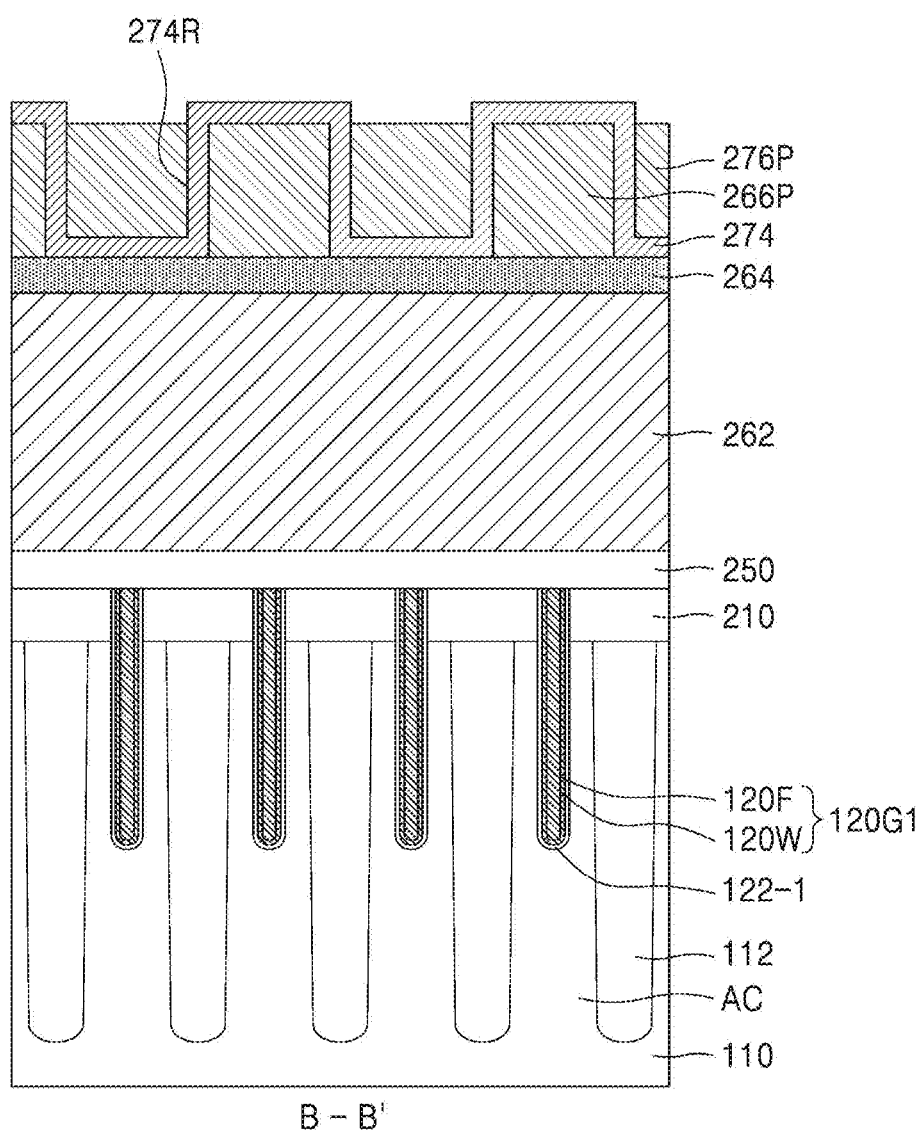

Referring to FIGS. 17A and 17B, an exposed portion of the second buried layer 276 may be etched by using the second trimming mask pattern 282 as an etching mask. Thereafter, the second liner 274 and the edge portions 266PE of the second base layer patterns 266P exposed in an area that is not covered with the second trimming mask pattern 282 may be removed.

A plurality of second buried layer patterns 276P disposed in the recesses 274R may be formed by removing the second trimming mask pattern 282 to expose a portion of the second buried layer 276 covered with the second trimming mask pattern 282 and removing an upper portion of the second buried layer 276 until the top surface of the second liner 274 is exposed.

Figure 18A:
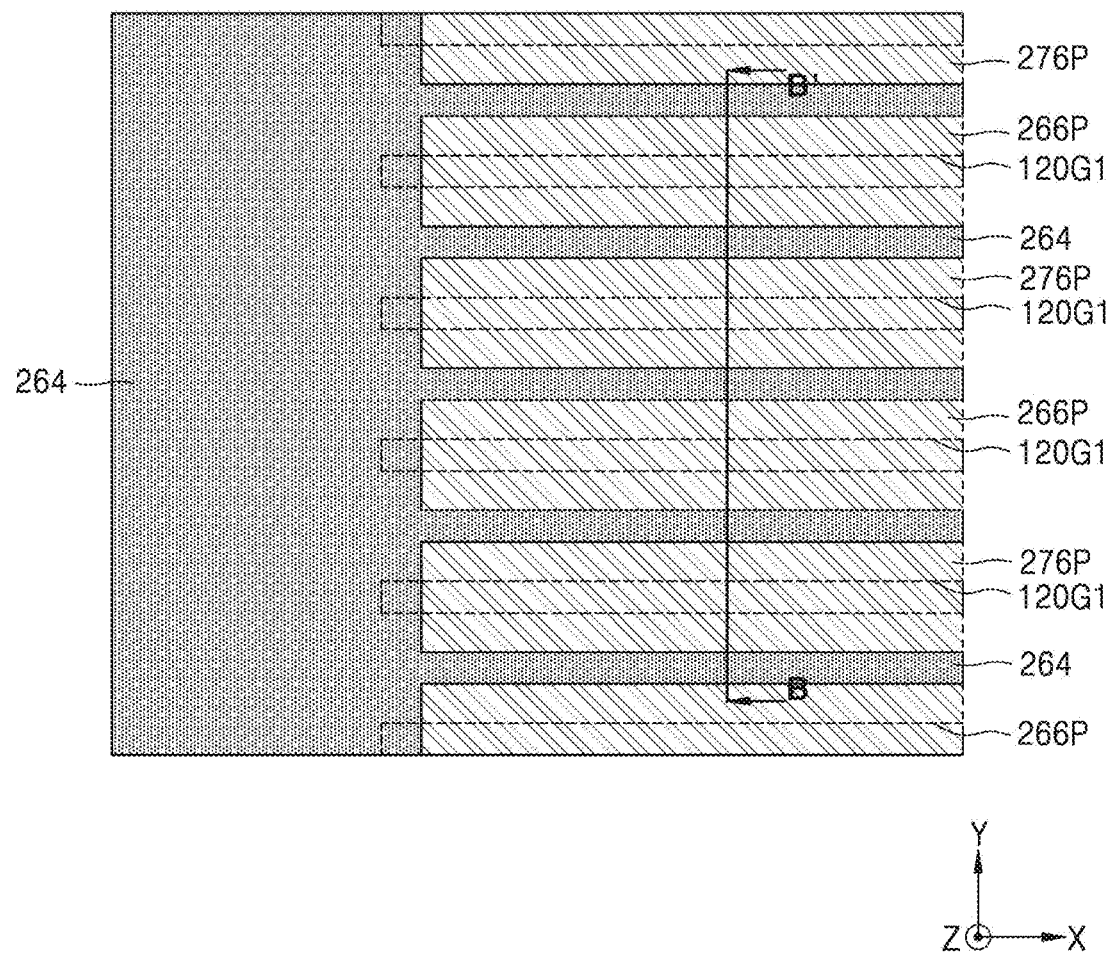
Figure 18B:
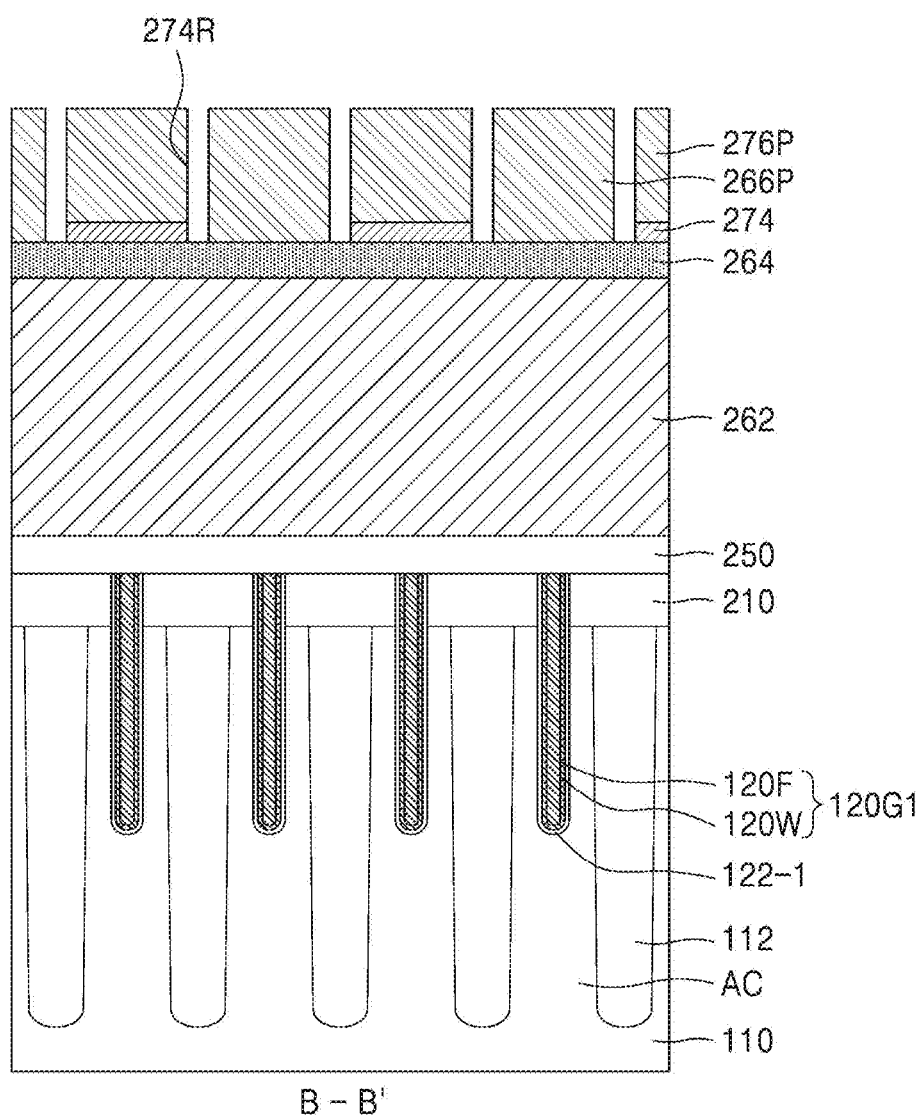

Referring to FIGS. 18A and 18B, top surfaces of the plurality of second base layer patterns 266P may be exposed by removing the exposed portion of the second liner 274.

Figure 19A:
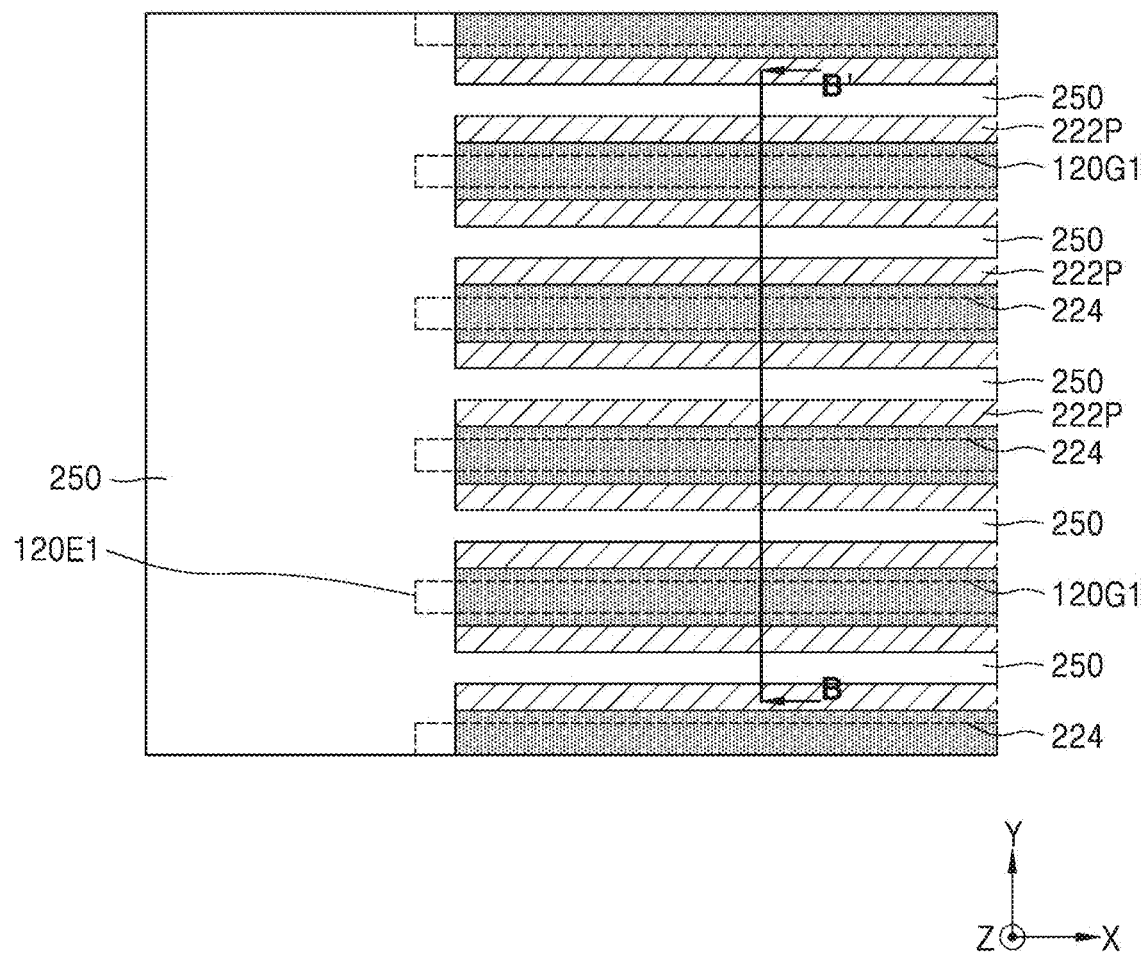
Figure 19B:
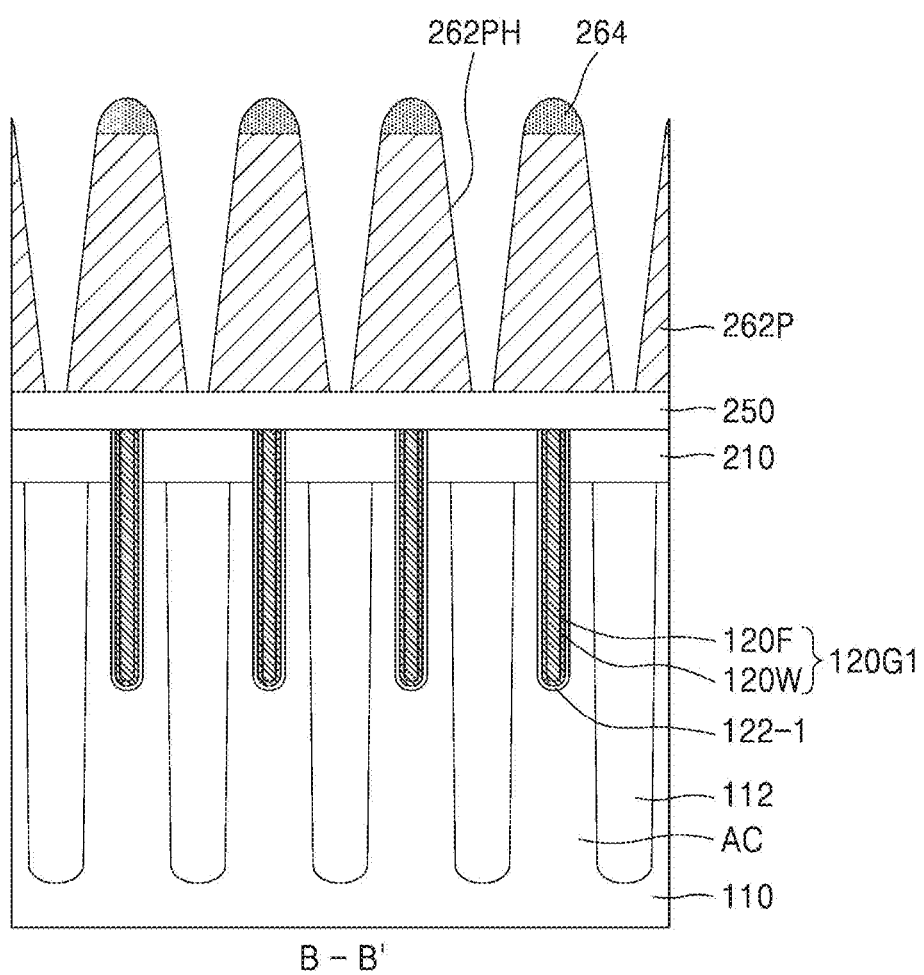

Referring to FIGS. 19A and 19B, the plurality of second hard mask patterns 262P may be formed by etching the second hard mask layer 262 by using the plurality of second base layer patterns 266P and the plurality of second buried layer patterns 276P as etching masks. Holes 262PH that are formed by sidewalls of the plurality of second hard mask patterns 262P may be disposed in positions that do not vertically overlap the plurality of first gate electrodes 120G1. In the plan view of FIG. 19A, the plurality of second hard mask patterns 262P may be disposed to not vertically overlap the first end portions 120E1 of the plurality of first gate electrodes 120G1.

Figure 20A:
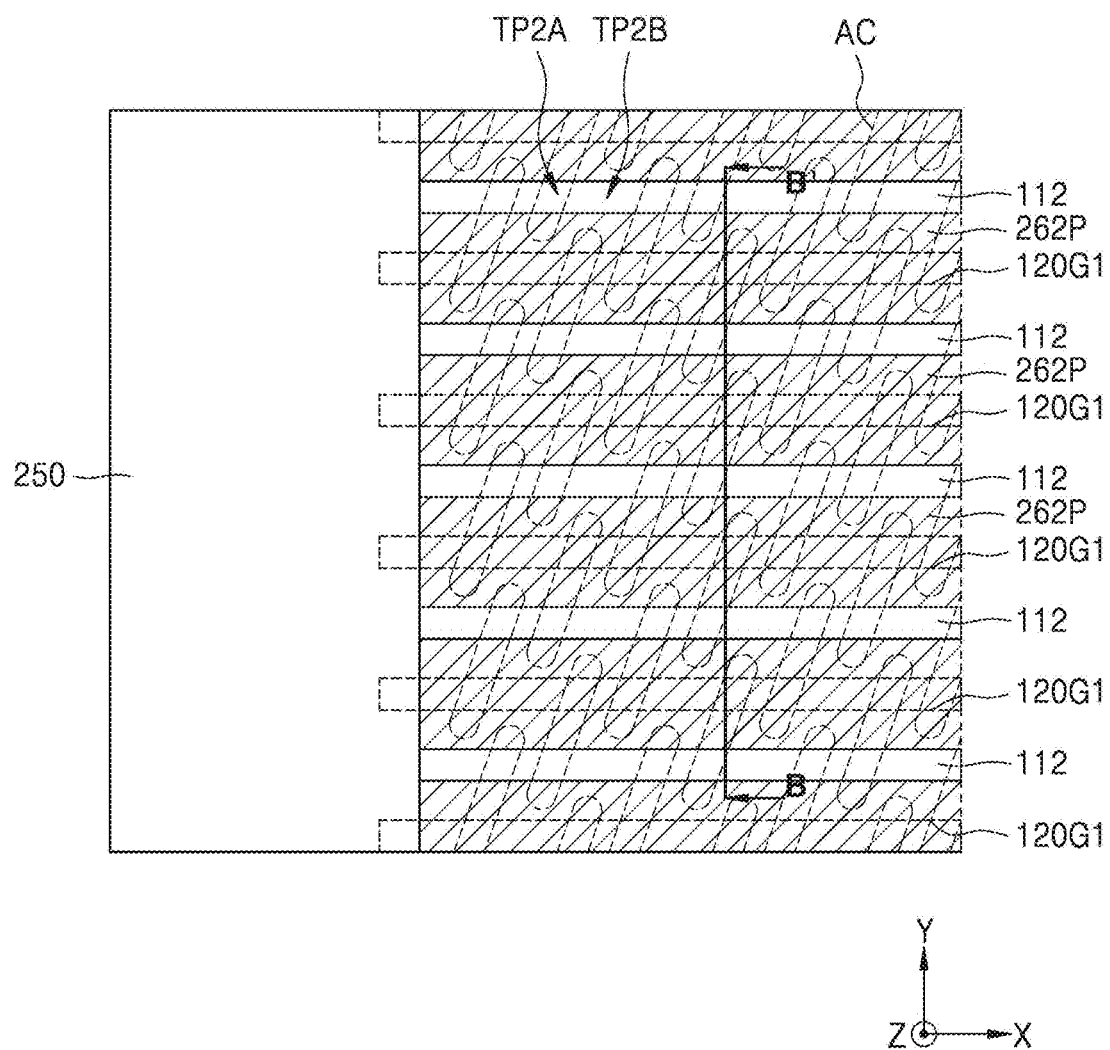
Figure 20B:
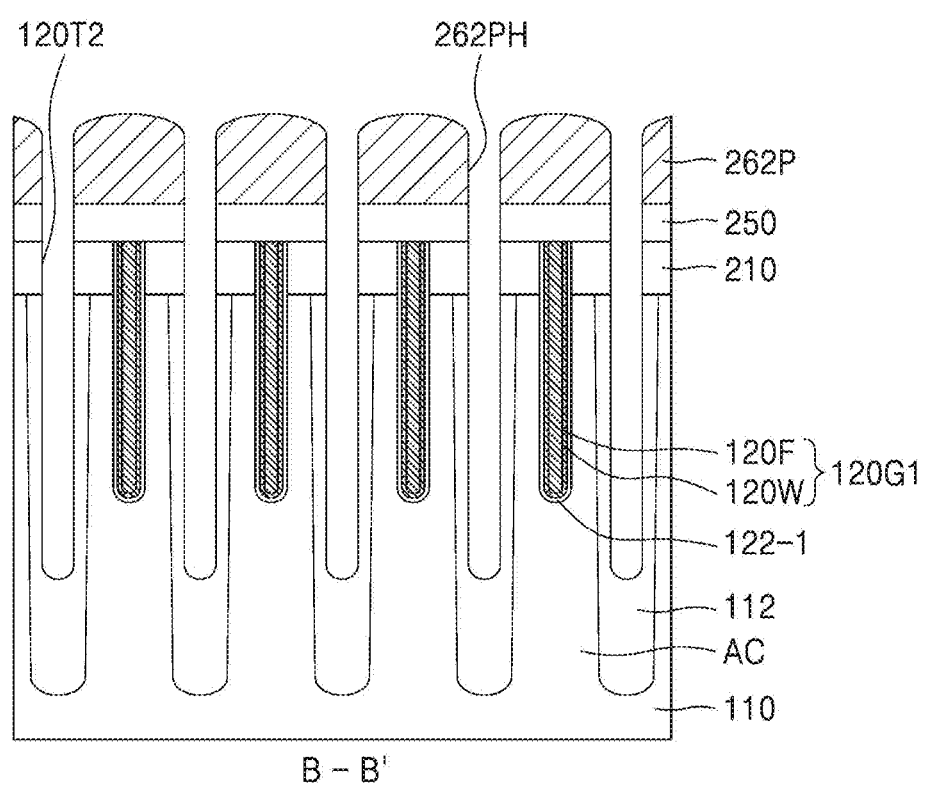

Referring to FIGS. 20A and 20B, the plurality of second trenches 120T2 may be formed by etching the second buffer insulating layer 250, the first buffer insulating layer 210, the active areas AC, and the device isolation layers 112 by using the second hard mask patterns 262P as etching masks. Each of the plurality of second trenches 120T2 may be disposed between two adjacent first trenches 120T1 of the plurality of first trenches 120T1.

The plurality of second trenches 120T2 may include the third portions TP2A vertically overlapping the plurality of active areas AC and the fourth portions TP2B vertically overlapping the device isolation layers 112, and the bottom surfaces of the third portions TP2A may be disposed at a higher level than the bottom surfaces of the fourth portions TP2B. Therefore, the bottom surfaces of the third portions TP2A may have the third depth D3 (see FIG. 2B) from the top surface 110M of the substrate 110, the bottom surfaces of the fourth portions TP2B may have the fourth depth D4 (see FIG. 2B) from the top surface 110M of the substrate 110, and the fourth depth D4 may be deeper than the third depth D3.

Figure 21A:
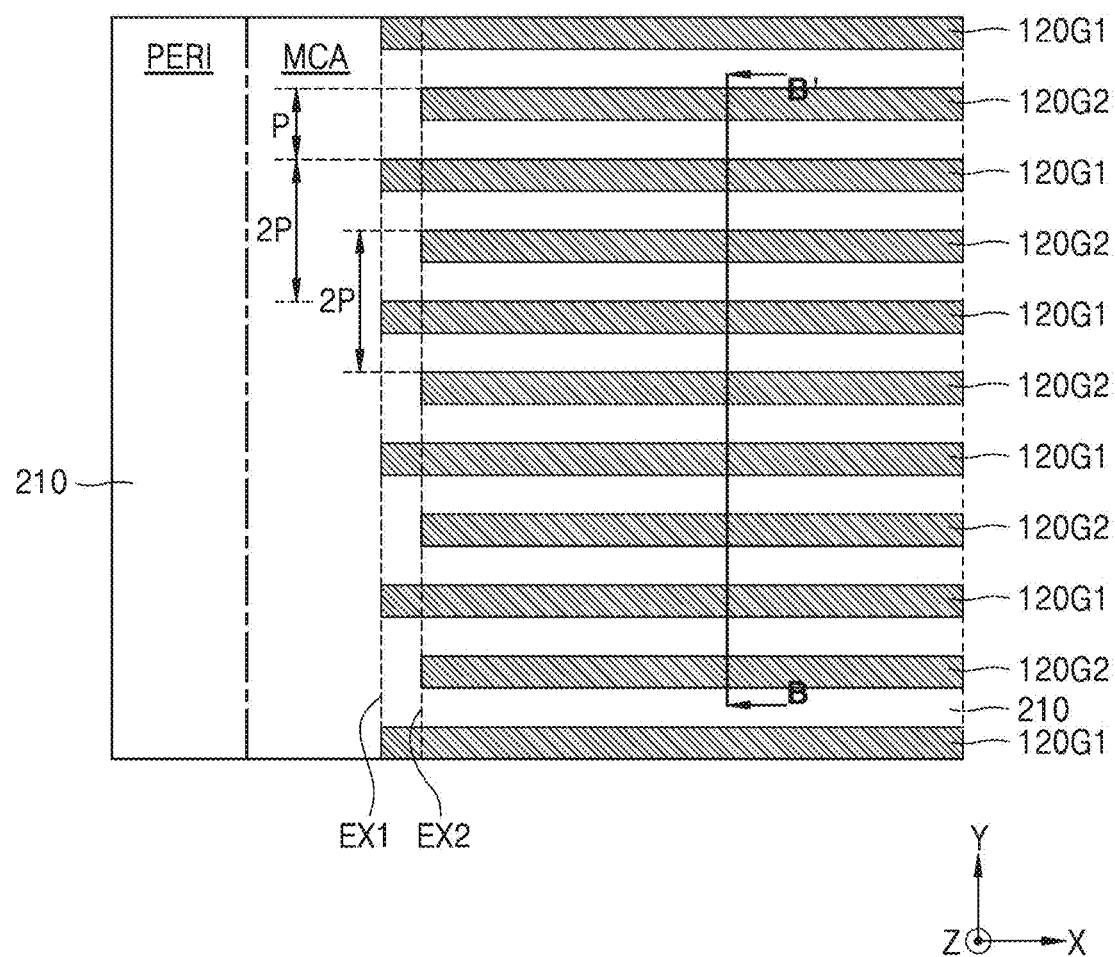
Figure 21B:
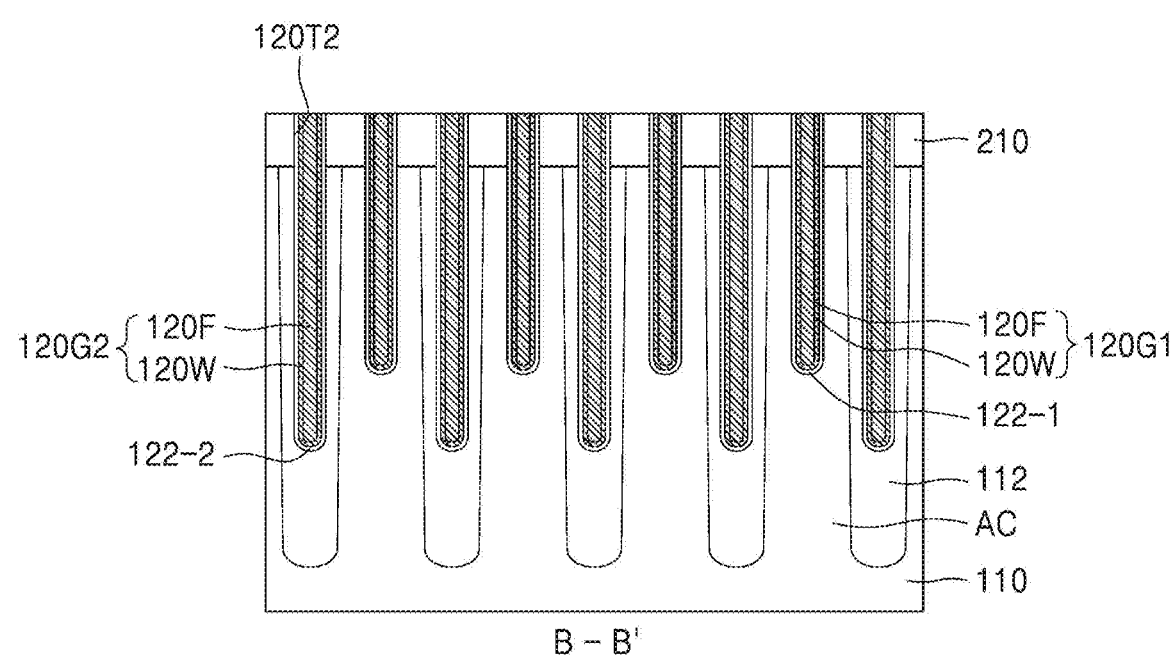

Referring to FIGS. 21A and 21B, the second hard mask patterns 262P may be removed, and the second gate insulating layers 122-2 may be formed in, e.g. in the sidewalls of, the plurality of second trenches 120T2. Thereafter, the plurality of second gate electrodes 120G2 that fill the plurality of second trenches 120T2 may be formed on the second gate insulating layers 122-2. The plurality of second gate electrodes 120G2 may be formed of the same material as, or of different material from, the plurality of the first gate electrodes 120G1.

In a planarization process of conductive layers for forming the plurality of second gate electrodes 120G2, the second buffer insulating layer 250 may be removed, and the top surfaces of the plurality of first gate electrodes 120G1 may be exposed together.

In the plan view of FIG. 21A, the plurality of second gate electrodes 120G2 may be disposed at the second pitch of 2P in the second direction (the Y direction), and the second pitch of 2P may be the same as the first pitch of 2P. As the plurality of first gate electrodes 120G1 and the plurality of second gate electrodes 120G2 are alternately disposed and respectively arranged at the second pitch of 2P, the plurality of first gate electrodes 120G1 and the plurality of second gate electrodes 120G2 may collectively have the pitch P of the fine patterns finally formed. The second end portions 120E2 of the plurality of second gate electrodes 120G2 may be aligned with the second extension line EX2, and the second extension line EX2 may correspond to the edge of the second trimming mask pattern 282 (see FIG. 16A).

Figure 22A:
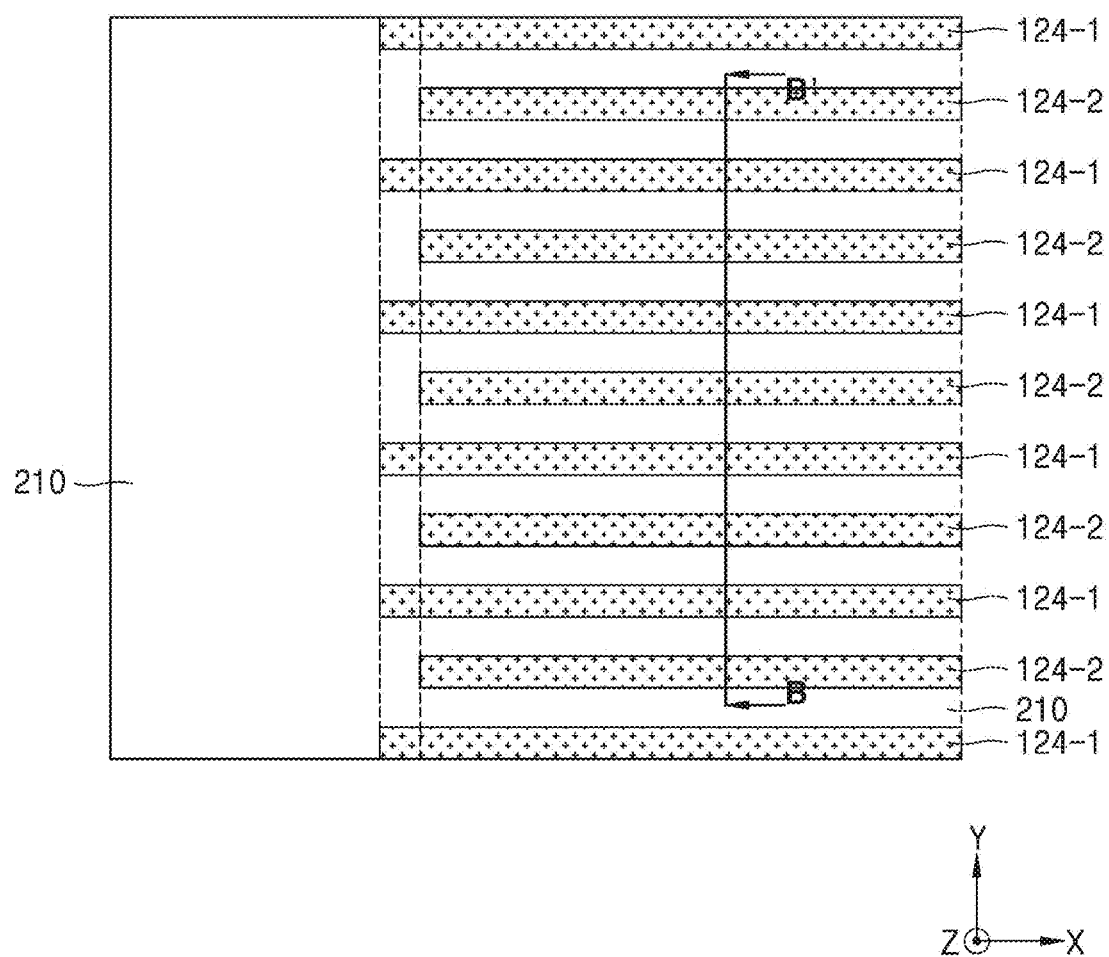
Figure 22B:
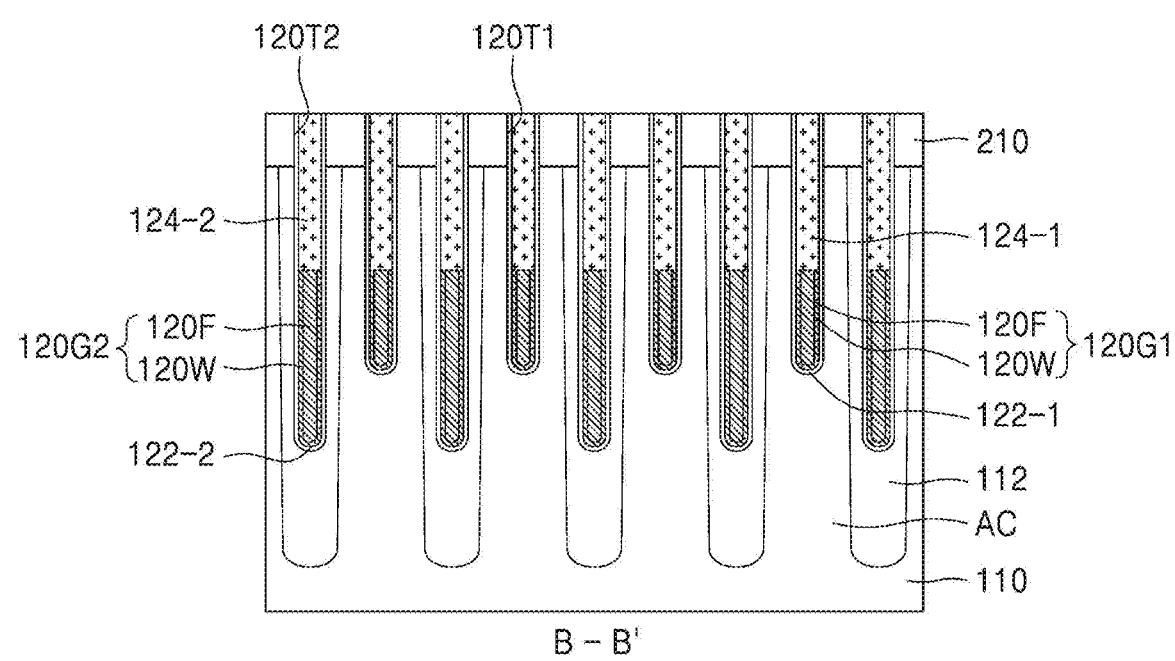

Referring to FIGS. 22A and 22B, upper portions of sidewalls of the plurality of first trenches 120T1 and the plurality of second trenches 120T2 may be exposed by removing upper portions of the plurality of first gate electrodes 120G1 and the plurality of second gate electrodes 120G2, and the first gate capping layers 124-1 and the second gate capping layers 124-2 may be respectively formed in the plurality of first trenches 120T1 and the plurality of second trenches 120T2.

Referring to FIGS. 2A and 2B again, the first and second source/drain areas SD1 and SD2 may be formed by implanting impurity ions over the substrate 110.

Thereafter, the bitline structures 130, and the first insulating layer 142 and the second insulating layer 144 surrounding the bitline structures 130 may be formed on the substrate 110. For example, the first insulating layer 142 may be first formed, and then holes (not shown) exposing top surfaces of the first source/drain areas SD1 may be formed in the first insulating layer 142. The bitline contacts 132 that fill the holes may be formed in the first insulating layer 142.

The bitline capping layers 136 and the bitlines 134 extending in the Y direction (see FIG. 1) parallel to the top surface 110M of the substrate 110 may be formed by sequentially forming a conductive layer (not shown) and an insulating layer (not shown) on the first insulating layer 142 and patterning the insulating layer and the conductive layer. Thereafter, the bitline spacers 138 may be formed on the bitline contacts 132 and on sidewalls of the bitlines 134 and the bitline capping layers 136. The second insulating layer 144 and the third insulating layer 146 that cover the bitline structures 130 may be formed on the first insulating layer 142.

Thereafter, holes (not shown) that expose top surfaces of the second source/drain areas SD2 may be formed in the first, second, and third insulating layers 142, 144, and 146, and the capacitor contacts 150 may be formed in the holes. In some example embodiments, the capacitor contacts 150 may be formed by sequentially forming lower contact patterns (not shown), metal silicide layers (not shown), barrier layers (not shown), and upper contact patterns (not shown) in the holes. Thereafter, the capacitor structures CS1 may be formed on the capacitor contacts 150 and the third insulating layer 146.

In general, hard mask patterns are formed by QPT, and a plurality of trenches are formed in a substrate by using the hard mask patterns as etching masks. However, when gaps between the plurality of trenches are narrow, shape deformations of the plurality of trenches, such as bending of the plurality of trenches due to stress induced in a gate electrode forming process, may occur, and thus shape deformations of a plurality of gate electrodes disposed in the plurality of trenches occur. Shape deformations may deleteriously affect the electrical performance of the semiconductor device, such as the refresh performance.

However, according to some example embodiments, by using double patterning technology (DPT), e.g. two applications of DPT, the plurality of first trenches 120T1 and the plurality of first gate electrodes 120G1 may be first formed by using the first hard mask patterns 222P, and then the plurality of second trenches 120T2 and the plurality of second gate electrodes 120G2 may be formed by using the second hard mask patterns 262P. Therefore, since space distances between the plurality of first trenches 120T1 are relatively large, a phenomenon in which the first trenches 120T1 are bent due to stress generation in the process of forming the plurality of first gate electrodes 120G1 may be reduced or prevented. Also, as shapes of the plurality of first trenches 120T1 are uniformly formed, heights of the plurality of first gate electrodes 120G1 may be more precisely adjusted in the etch back process of the plurality of first gate electrodes 120G1.

Figure 23:
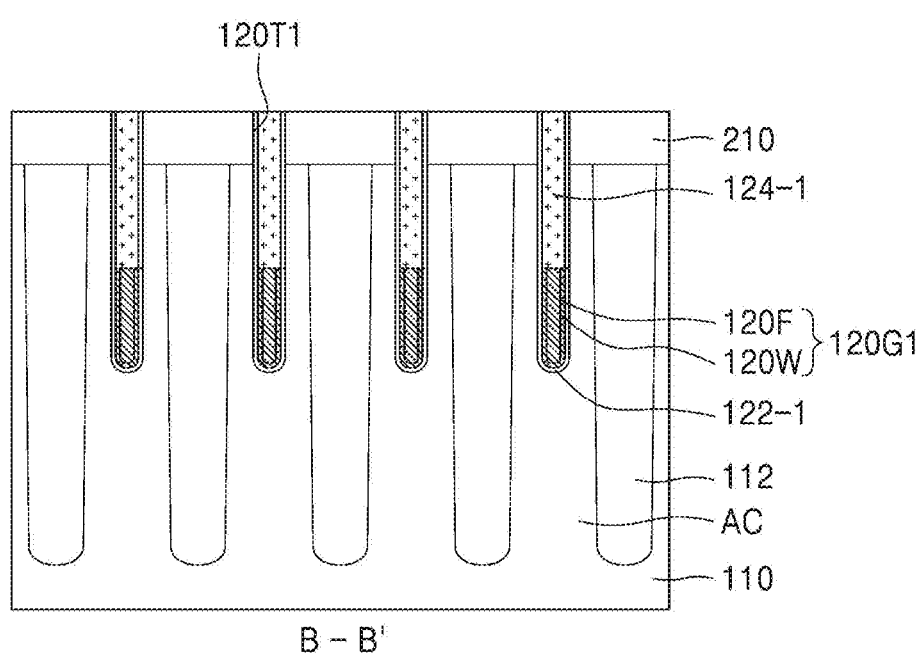
FIG. 23 is a cross-sectional view illustrating a method of manufacturing an integrated circuit device according to some example embodiments.

FIG. 23 is a cross-sectional view illustrating a method of manufacturing the integrated circuit device 100, according to some example embodiments. FIG. 23 is a cross-sectional view corresponding to a cross-section taken along line B-B' of FIG. 12A. The same reference numerals in FIG. 23 as those in FIGS. 1 through 22B denote the same elements.

The plurality of first gate electrodes 120G1 are formed in the plurality of first trenches 120T1 by performing the processes described above with reference to FIGS. 3A through 12A.

Referring to FIG. 23, upper portions of the plurality of first gate electrodes 120G1 may be removed, and the first gate capping layers 124-1 may be formed on exposed sidewalls of the plurality of first trenches 120T1.

Thereafter, the processes described above with reference to FIGS. 13A through 21B may be performed to form the plurality of second gate electrodes 120G2 in the plurality of second trenches 120T2, remove the upper portions of the plurality of second gate electrodes 120G2, and form the second gate capping layers 124-2 on exposed sidewalls of the plurality of second trenches 120T2.

While inventive concepts has been particularly shown and described with reference to embodiments thereof, it will be understood that various changes in form and details may be made therein without departing from the spirit and scope of the following claims.

What is claimed is:

1. A method of manufacturing an integrated circuit device, the method comprising:
forming first hard mask patterns over a substrate, the first hard mask patterns extending in a first direction parallel to a top surface of the substrate, the first hard mask patterns arranged at a first pitch in a second direction, the second direction being perpendicular to the first direction;
forming a plurality of first trenches in the substrate by using the first hard mask patterns as etching masks;
forming a plurality of first gate electrodes in the plurality of first trenches;
forming second hard mask patterns over the substrate, the second hard mask patterns extending in the first direction and arranged in the second direction at a second pitch;
forming a plurality of second trenches in the substrate by using the second hard mask patterns as etching masks, each of the plurality of second trenches being between two adjacent first trenches of the plurality of first trenches; and
forming a plurality of second gate electrodes in the plurality of second trenches, wherein
the plurality of first gate electrodes alternate with the plurality of second gate electrodes in the second direction.

2. The method of claim 1, wherein
the second pitch is equal to the first pitch.

3. The method of claim 1, further comprising:
forming device isolation layers in the substrate, the device isolation layers defining a plurality of active areas,
wherein the forming the plurality of first trenches comprises forming the plurality of first trenches extending in the first direction so that each of the plurality of first trenches intersect with the plurality of active areas and the device isolation layers, and the forming the plurality of second trenches comprises forming the plurality of second trenches extending in the first direction so that each of the plurality of second trenches intersect with the plurality of active areas and the device isolation layers.

4. The method of claim 3, wherein, the plurality of first trenches comprise first portions and second portions, the first portions vertically overlapping the plurality of active areas, and the second portions vertically overlapping the device isolation layers, bottom surfaces of the first portions have a first depth from the top surface of the substrate, bottom surfaces of the second portions have a second depth from the top surface of the substrate that is greater than the first depth, the plurality of second trenches comprise third portions and fourth portions, the third portions vertically overlapping the plurality of active areas and the fourth portions vertically overlapping the device isolation layers, bottom surfaces of the third portions have a third depth from the top surface of the substrate, and bottom surfaces of the fourth portions have a fourth depth from the top surface of the substrate that is greater than the third depth.

5. The method of claim 4, wherein, the first depth is substantially equal to the third depth, and the second depth is substantially equal to the fourth depth.

6. The method of claim 1, wherein the forming the first hard mask patterns comprises:

forming a first hard mask layer over the substrate;

forming a plurality of first base layer patterns on the first hard mask layer, the plurality of first base layer patterns arranged at a first reference pitch and extending in the first direction;

forming a first liner covering top surfaces and sidewalls of the plurality of first base layer patterns, the first liner having a top surface in which a plurality of first recesses between two adjacent first base layer patterns of the plurality of first base layer patterns are formed;

forming a first buried layer on the first liner to fill the plurality of first recesses;

removing an edge portion of the first buried layer;

exposing the plurality of first base layer patterns by removing a portion of the first liner; and forming the first hard mask patterns by etching the first hard mask layer using first etching masks, the first etching masks including portions of the plurality of first base layer patterns and including the first buried layer that is filled in the plurality of first recesses.

7. The method of claim 6, wherein, the forming the plurality of first base layer patterns and the forming the first buried layer comprise, coating an organic compound on the substrate, the organic compound including a hydrocarbon compound and a derivative thereof, and baking the coated organic compound.

8. The method of claim 6, wherein the removing the edge portion of the first buried layer comprises:

forming a first trimming mask pattern over the first buried layer; and removing the edge portion of the first buried layer and edge portions of the first base layer patterns by using the first trimming mask pattern as an etching mask.

9. The method of claim 1, wherein the forming the second hard mask patterns occurs after the forming of the first hard mask patterns and comprises:

forming a second hard mask layer over the substrate;

forming a plurality of second base layer patterns on the second hard mask layer, the plurality of second base layer patterns arranged at a second reference pitch and extending in the first direction;

forming a second liner covering top surfaces and sidewalls of the plurality of second base layer patterns, the second liner having a top surface in which a plurality of second recesses positioned between two adjacent second base layer patterns of the plurality of second base layer patterns are formed;

forming a second buried layer on the second liner to fill the plurality of second recesses;

removing an edge portion of the second buried layer;

exposing the plurality of second base layer patterns by removing a portion of the second liner; and forming the second hard mask patterns by etching the second hard mask layer using second etching masks, the second etching masks including portions of the plurality of second base layer patterns and including the second buried layer that is filled in the plurality of second recesses.

10. The method of claim 9, wherein the removing the edge portion of the second buried layer comprises:

forming a second trimming mask pattern over the second buried layer; and removing the edge portion of the second buried layer and edge portions of the second base layer patterns by using the second trimming mask pattern as an etching mask.

11. The method of claim 1, (i) after the forming the plurality of first gate electrodes and before the forming the second hard mask patterns, further including, removing portions of the plurality of first gate electrodes in upper portions of the plurality of first trenches, and forming a plurality of first gate capping layers filling the upper portions of the plurality of first trenches; and (ii) after the forming the plurality of second gate electrodes, further including, removing portions of the plurality of second gate electrodes disposed in upper portions of the plurality of second trenches, and forming a plurality of second gate capping layers filling the upper portions of the plurality of second trenches.

12. The method of claim 1, after the forming the plurality of second gate electrodes, further comprising:

removing portions of the plurality of first gate electrodes in upper portions of the plurality of first trenches and portions of the plurality of second gate electrodes in upper portions of the plurality of second trenches; and forming a plurality of first gate capping layers filling the upper portions of the plurality of first trenches and a plurality of second gate capping layers filling the upper portions of the plurality of second trenches.

13. The method of claim 1, after the forming the plurality of first gate electrodes and before the forming the second hard mask patterns, further comprising:

forming a buffer insulating layer covering the plurality of first gate electrodes over the substrate, wherein the forming the second hard mask patterns comprises forming the second hard mask patterns on the buffer insulating layer.

14. A method of manufacturing an integrated circuit device, the method comprising:
    forming first hard mask patterns over a substrate, the first hard mask patterns extending in a first direction parallel to a top surface of the substrate, the first hard mask patterns arranged at a first pitch in a second direction, the second direction being perpendicular to the first direction;
    forming a plurality of first trenches in the substrate by using the first hard mask patterns as etching masks;
    removing the first hard mask patterns;
    forming a plurality of first gate electrodes in the plurality of first trenches;
    forming second hard mask patterns over the substrate, the second hard mask patterns extending in the first direction and arranged at a second pitch in the second direction;
    forming a plurality of second trenches in the substrate by using the second hard mask patterns as etching masks, each of the plurality of second trenches being between two adjacent first trenches of the plurality of first trenches;
    removing the second hard mask patterns; and
    forming a plurality of second gate electrodes in the plurality of second trenches, wherein,
    in the forming the second hard mask patterns, end portions of the plurality of first gate electrodes are not vertically overlapped by holes on sidewalls of the second hard mask patterns, the end portions of the plurality of first gate electrodes extending in the first direction, and
    the plurality of first trenches alternate with the plurality of second trenches in the second direction.

15. The method of claim 14, wherein the end portions of the plurality of first gate electrodes protrude outwards with respect to end portions of the plurality of second gate electrodes in a plan view, the end portions of the plurality of second gate electrodes extending in the first direction.

16. A method of manufacturing an integrated circuit device, the method comprising:
    forming device isolation layers in a substrate, the device isolation layers defining a plurality of active areas;
    forming first hard mask patterns over the substrate, the first hard mask patterns extending in a first direction parallel to a top surface of the substrate, the first hard mask patterns arranged at a first pitch in a second direction, the second direction perpendicular to the first direction;
    forming a plurality of first trenches in the substrate by using the first hard mask patterns as etching masks;
    forming a plurality of first gate electrodes in the plurality of first trenches;
    forming second hard mask patterns over the substrate, the second hard mask patterns extending in the first direction and arranged at a second pitch in the second direction;
    forming a plurality of second trenches in the substrate by using the second hard mask patterns as etching masks, wherein each of the plurality of second trenches is between two adjacent first trenches of the plurality of first trenches; and
    forming a plurality of second gate electrodes in the plurality of second trenches, wherein
    the plurality of first trenches intersect with the plurality of active areas and the device isolation layers,
    the plurality of second trenches intersect with the plurality of active areas and the device isolation layers, and
    the plurality of first trenches alternate with the plurality of second trenches in the second direction.

17. The method of claim 16, wherein,
    the second pitch is substantially equal to the first pitch.

18. The method of claim 16, wherein,
    in the forming the second hard mask patterns, end portions of the plurality of first gate electrodes are not vertically overlapped by holes on sidewalls of the second hard mask patterns, and
    the end portions of the plurality of first gate electrodes protrude outwards with respect to end portions of the plurality of second gate electrodes in a plan view, the end portions of the plurality of first gate electrodes and the end portions of the plurality of second gate electrodes extending in the first direction.

19. The method of claim 16, wherein the forming the first hard mask patterns and the forming the second hard mask patterns each comprise:
    forming a hard mask layer over the substrate;
    forming a plurality of base layer patterns over the hard mask layer, the plurality of base layer patterns arranged at a reference pitch and extending in the first direction;
    forming a liner covering top surfaces and sidewalls of the plurality of base layer patterns, the liner having a top surface in which a plurality of recesses between two adjacent base layer patterns of the plurality of base layer patterns are formed;
    forming a buried layer on the liner to fill the plurality of recesses;
    removing an edge portion of the buried layer;
    exposing the plurality of base layer patterns by removing a portion of the liner; and
    etching the hard mask layer by using hard mask layer etching masks, the hard mask layer etching masks including portions of the plurality of base layer patterns and the buried layer filled in the plurality of recesses.

20. The method of claim 19, wherein the removing the edge portion of the buried layer comprises,
    forming a trimming mask pattern over the buried layer, and
    removing the edge portion of the buried layer and edge portions of the plurality of base layer patterns using the trimming mask pattern as an etching mask.

* * * * *